US010538089B2

(12) United States Patent
Kitazawa et al.

(10) Patent No.: US 10,538,089 B2
(45) Date of Patent: Jan. 21, 2020

(54) HEAD UNIT

(71) Applicant: Seiko Epson Corporation, Tokyo (JP)

(72) Inventors: Koji Kitazawa, Shiojiri (JP); Masahiko Tsuyuki, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/174,694

(22) Filed: Oct. 30, 2018

(65) Prior Publication Data

US 2019/0126619 A1 May 2, 2019

(30) Foreign Application Priority Data

Oct. 31, 2017 (JP) ................................. 2017-211018

(51) Int. Cl.
| | | |
|---|---|---|
| B41J 2/14 | (2006.01) | |
| H05K 1/14 | (2006.01) | |
| H01L 41/04 | (2006.01) | |
| H01L 41/09 | (2006.01) | |
| H01L 27/32 | (2006.01) | |

(Continued)

(52) U.S. Cl.
CPC ............ *B41J 2/14209* (2013.01); *B41J 2/01* (2013.01); *B41J 2/14274* (2013.01); *H01L 27/3276* (2013.01); *H01L 41/042* (2013.01); *H01L 41/0475* (2013.01); *H01L 41/0973* (2013.01); *H01L 51/0021* (2013.01);

(Continued)

(58) Field of Classification Search
CPC ................................................ B41J 2/14201; B41J 2/14209; B41J 2/14233; B41J 2/14274; B41J 2002/14491; B41J 2202/19; B41J 2202/20; H01R 12/62; H01R 12/79; H05K 1/147; H01L 27/3276; H01L 41/042; H01L 41/0475; H01L 41/0973; H01L 51/0021
See application file for complete search history.

(56) References Cited

U.S. PATENT DOCUMENTS 6,190,196 B1 * 2/2001 Kato ..................... H01R 12/772
439/493
6,814,588 B1 * 11/2004 Dunlavy .............. H01R 13/405
439/493

(Continued)

FOREIGN PATENT DOCUMENTS

| JP | 2011-207180 A | 10/2011 |
|---|---|---|
| JP | 5181898 B2 | 4/2013 |

*Primary Examiner* — Anh T Vo
(74) *Attorney, Agent, or Firm* — Harness, Dickey & Pierce, P.L.C.

(57) ABSTRACT

There is provided a head unit including: a first substrate provided with a first terminal and a second terminal; a second substrate provided with a third terminal; a first flexible wiring substrate that connects the first terminal and the third terminal to each other; a first driving module that is electrically connected to the second substrate; a third substrate provided with a fourth terminal; a second flexible wiring substrate that connects the second terminal and the fourth terminal to each other; a second driving module that is electrically connected to the third substrate; and a liquid flow passage which is positioned between the second substrate and the third substrate, and supplies the liquid to the first driving module and the second driving module, in which the first substrate is positioned on the second substrate side in a direction intersecting with a direction in which a liquid is discharged.

19 Claims, 13 Drawing Sheets

(51) Int. Cl.
  *H01L 51/00* (2006.01)
  *H01L 41/047* (2006.01)
  *B41J 2/01* (2006.01)
  H01R 12/79 (2011.01)
  H01R 12/62 (2011.01)

(52) U.S. Cl.
  CPC ..... *H05K 1/147* (2013.01); *B41J 2002/14491* (2013.01); *H01R 12/62* (2013.01); *H01R 12/79* (2013.01)

(56) References Cited

U.S. PATENT DOCUMENTS

| | | | |
|---|---|---|---|
| 9,225,090 B2 * | 12/2015 | Chen | H01R 12/79 |
| 9,391,378 B2 * | 7/2016 | Leddige | H01R 12/721 |
| 9,415,592 B2 | 8/2016 | Iijima | |
| 2009/0278896 A1 | 11/2009 | Akahane | |
| 2011/0242194 A1 | 10/2011 | Hotta et al. | |
| 2017/0066240 A1 * | 3/2017 | Hirai | B41J 2/1646 |

\* cited by examiner

FIG. 2
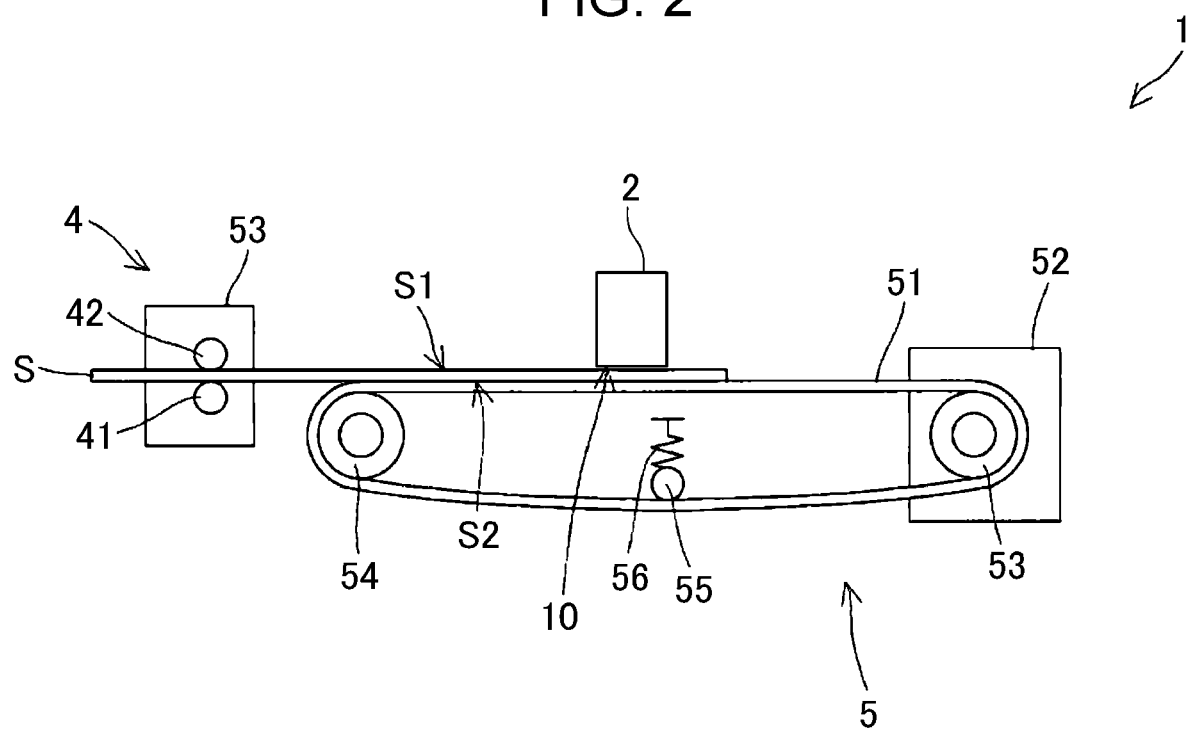
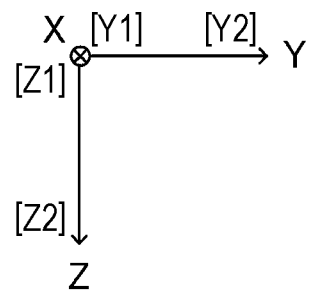

HEAD UNIT

The entire disclosure of Japanese Patent Application No. 2017-211018, filed Oct. 31, 2017 is expressly incorporated by reference herein.

BACKGROUND

1. Technical Field

The present invention relates to a head unit.

2. Related Art

As an ink jet printer for printing an image or a document by discharging a liquid, such as ink, a printer using a piezoelectric element (for example, a piezo element) is known. A piezoelectric element is provided in accordance with each of a plurality of nozzles in a print head, each of the piezoelectric elements is driven according to a driving signal, and accordingly, a predetermined amount of liquid is discharged from the nozzles at a predetermined timing to form dots on a medium. Since the piezoelectric element is a capacitive load, such as a capacitor, in terms of electricity, it is necessary to supply a sufficient current in order to operate the piezoelectric element of each of the nozzles.

Japanese Patent No. 5181898 and JP-A-2011-207180 disclose a technique of discharging ink from a nozzle opening by providing a piezoelectric element in a head main body (head unit) and generating a pressure change in a pressure generating chamber by driving the piezoelectric element.

In such a head unit, in recent years, a printing request for high speed and high precision of a liquid discharge apparatus, specifically, a printing request for high speed that exceeds 30 ipm (hereinafter, only referred to as high speed) and high accuracy that exceeds 600 dpi (hereinafter, only referred to as high accuracy), has increased. In response to such a high-speed and high-accuracy printing request, high-speed printing by increasing the number of nozzles, and further, high-accuracy printing by an increase in the density of nozzles based on size reduction of piezoelectric elements using MEMS technology, have been made possible.

However, in accordance with the increase in the density of nozzles and the number of nozzles, there is a possibility that the discharge characteristics among the nozzles vary due to generation of deviation of an ink pressure in each nozzle, and further, in a wiring of the related art, a new problem that it is difficult to supply sufficient electric power for driving all of the piezoelectric elements.

SUMMARY

An advantage of some aspects of the invention, it is possible to provide a head unit capable of reducing at least one of the problems caused by a large number of nozzles with a high density.

The invention can be realized in the following aspects or application examples.

Application Example 1

According to this application example, there is provided a head unit including: a first substrate provided with a first terminal and a second terminal; a second substrate provided with a third terminal; a first flexible wiring substrate that connects the first terminal and the third terminal to each other; a first driving module that includes a plurality of first piezoelectric elements, a plurality of first cavities which are associated with the plurality of first piezoelectric elements and of which an internal volume changes due to displacement of the associated first piezoelectric elements, and a plurality of first nozzles which are associated with the plurality of first cavities, which discharge a liquid corresponding to the change in the internal volume of the associated first cavities, and of which the provided number is 600 or more with a density of 300 or more per one inch, and is electrically connected to the second substrate; a third substrate provided with a fourth terminal; a second flexible wiring substrate that connects the second terminal and the fourth terminal to each other; a second driving module that includes a plurality of second piezoelectric elements, a plurality of second cavities which are associated with the plurality of second piezoelectric elements and of which an internal volume changes due to displacement of the associated second piezoelectric elements, and a plurality of second nozzles which are associated with the plurality of second cavities, which discharge the liquid corresponding to the change in the internal volume of the associated second cavities, and of which the provided number is 600 or more with a density of 300 or more per one inch, and is electrically connected to the third substrate; and a liquid flow passage which is positioned between the second substrate and the third substrate and through which the liquid is supplied to the first driving module and the second driving module, in which the first substrate is positioned on the second substrate side in a direction intersecting with a direction in which the liquid is discharged from the first nozzle or the second nozzle.

The expression "electrically connected" is not limited to being directly electrically connected, but may be being electrically connected, for example, via a substrate or a wiring.

In the head unit according to the application example, by providing the liquid flow passage between the second substrate connected to the first driving module and the third substrate connected to the second driving module, it is possible to provide the liquid flow passage for supplying the liquid to the first driving module and the second driving module on an intermediate point between the first driving module and the second driving module.

Accordingly, it is possible to smoothly supply ink from the liquid flow passage to the first driving module and the second driving module.

Furthermore, by providing the first substrate on the second substrate side in the direction intersecting with the direction in which the liquid is discharged from the first nozzle or the second nozzle, it is possible to ensure a wide liquid flow passage for supplying the liquid to the first driving module and the second driving module without being interfered by the first substrate, and it is possible to more smoothly supply the ink to the first driving module and the second driving module.

In this manner, in the head unit according to the application example, since it is possible to smoothly supply the ink from the liquid flow passage to the first driving module and the second driving module, and it is possible to ensure a wide liquid flow passage, even in a case where the plurality of modules (the first driving module and the second driving module) including 600 or more nozzles with a density of 300 or more per one inch are provided, it is possible to reduce variations in ink pressure, and accordingly, it is possible to improve the discharge accuracy of the liquid.

In addition, in the head unit according to the application example, the first substrate is connected to the second substrate electrically connected to the first driving module via the first flexible wiring substrate, and further, the first substrate is also connected to the third substrate electrically connected to the second driving module via the second flexible wiring substrate.

In other words, the first substrate branches the input signal and transfers the branched signal to each of the first driving module and the second driving module. Accordingly, it is possible to reduce the current that flows through each of the first flexible wiring substrate and the second flexible wiring substrate. Accordingly, in the head unit according to the application example, even in a case where the first substrate has a large number of nozzles by branching and transferring the signal, it is possible to supply sufficient electric power for driving all of the plurality of piezoelectric elements via the first flexible wiring substrate and the second flexible wiring substrate.

Application Example 2

In the head unit according to the application example, at least one side of the first substrate may be positioned so as to overlap at least one side of the second substrate in the direction in which the liquid is discharged from the first nozzle or the second nozzle.

In the head unit according to the application example, since the first substrate is positioned to be closer to the second substrate by positioning at least one side of the first substrate to overlap at least one side of the second substrate, it is possible to further reduce interference with the liquid flow passage for supplying the liquid to the first driving module and the second driving module by the first substrate, to ensure a wider liquid flow passage, and to more smoothly supply the ink to the first driving module and the second driving module.

Application Example 3

In the head unit according to the application example, the liquid flow passage may be positioned further on the third substrate side than the first substrate in the direction intersecting with the direction in which the liquid is discharged from the first nozzle or the second nozzle.

In the head unit according to the application example, by providing the liquid flow passage further on the third substrate side than the first substrate, that is, on a side opposite to the second substrate side on which the first substrate is provided, it is possible to further reduce interference with the liquid flow passage by the first substrate, and to ensure a wider liquid flow passage for supplying the liquid to the first driving module and the second driving module.

Application Example 4

In the head unit according to the application example, a part of the first flexible wiring substrate may be positioned between the second substrate and the liquid flow passage.

In the head unit according to the application example, by providing a part of the first flexible wiring substrate between the second substrate and the flow passage, it is possible to prevent adherence of the liquid (liquid droplet) discharged from the first nozzle or the second nozzle to the first flexible wiring substrate and the third terminal by the second substrate. Accordingly, it is possible to reduce occurrence of electrolytic corrosion, short circuit and the like caused by the droplet that adheres to the third terminal.

Application Example 5

In the head unit according to the application example, a part of the second flexible wiring substrate may be positioned between the third substrate and the liquid flow passage.

In the head unit according to the application example, by providing a part of the second flexible wiring substrate between the third substrate and the flow passage, it is possible to prevent adherence of the liquid (liquid droplet) discharged from the first nozzle or the second nozzle to the second flexible wiring substrate and the fourth terminal by the third substrate. Accordingly, it is possible to reduce occurrence of electrolytic corrosion, short circuit and the like caused by the droplet that adheres to the fourth terminal.

Application Example 6

In the head unit according to the application example, a fifth terminal provided in the second substrate; a fourth substrate provided with a sixth terminal; and a third flexible wiring substrate that connects the fifth terminal and the sixth terminal to each other, may further be provided.

In the head unit according to the application example, by providing the fourth substrate in addition to the second substrate and connecting the second substrate and the fourth substrate to each other by the third flexible wiring substrate, a degree of freedom of design that corresponds an amount of current to be supplied, the size or structure of the liquid flow passage, and a use environment is improved, and it is possible to improve versatility.

Application Example 7

In the head unit according to the application example, a part of the third flexible wiring substrate may be positioned between the fourth substrate and the liquid flow passage.

In the head unit according to the application example, by providing a part of the third flexible wiring substrate between the fourth substrate and the flow passage, it is possible to prevent adherence of the liquid (liquid droplet) discharged from the first nozzle or the second nozzle to the third flexible wiring substrate and the sixth terminal by the fourth substrate. Accordingly, it is possible to reduce occurrence of electrolytic corrosion, short circuit and the like caused by the droplet that adheres to the sixth terminal.

Application Example 8

In the head unit according to the application example, in the direction in which the liquid is discharged from the first nozzle or the second nozzle, a distance between the first substrate and the second substrate may be greater than a distance between the second substrate and the fourth substrate, and the distance between the second substrate and the fourth substrate may be greater than a distance between the first driving module and the fourth substrate.

In the head unit according to the application example, it is possible to shorten the third flexible wiring substrate with respect to the first flexible wiring substrate that connects the first substrate and the second substrate to each other, and further, the wiring that connects the first driving module and the fourth substrate to each other can be shortened by the third flexible wiring substrate. Accordingly, by shortening the flexible wiring substrate which is likely to be influenced by disturbance noise as approaching the first driving module, contribution of the influence of the disturbance noise on the first driving module can be reduced.

Application Example 9

In the head unit according to the application example, a seventh terminal provided in the third substrate; a fifth substrate provided with an eighth terminal; and a fourth flexible wiring substrate that connects the seventh terminal and the eighth terminal to each other, may further be provided.

In the head unit according to the application example, by providing the fifth substrate in addition to the third substrate and connecting the third substrate and the fifth substrate to each other by the fourth flexible wiring substrate, a degree of freedom of design that corresponds an amount of current to be supplied, the size or structure of the liquid flow passage, and a use environment is improved, and it is possible to improve versatility.

Application Example 10

In the head unit according to the application example, a part of the fourth flexible wiring substrate may be positioned between the fifth substrate and the liquid flow passage.

In the head unit according to the application example, by providing a part of the fourth flexible wiring substrate between the fifth substrate and the flow passage, it is possible to prevent adherence of the liquid (liquid droplet) discharged from the first nozzle or the second nozzle to the fourth flexible wiring substrate and the eighth terminal by the fifth substrate. Accordingly, it is possible to reduce occurrence of electrolytic corrosion, short circuit and the like caused by the droplet that adheres to the eighth terminal.

Application Example 11

In the head unit according to the application example, a difference between a distance between the second substrate and the fourth substrate and a distance between the third substrate and the fifth substrate may be greater than a difference between a distance between the fourth substrate and the first driving module and a distance between the fifth substrate and the second driving module, and a difference between a distance between the first substrate and the second substrate and a distance between the first substrate and the third substrate may be greater than a difference between the distance between the second substrate and the fourth substrate and the distance between the third substrate and the fifth substrate.

In the head unit according to the application example, it is possible to reduce a difference between a length of the wiring of the third flexible wiring substrate and a length of the wiring of the fourth flexible wiring substrate with respect to a difference between a length of the wiring of the first flexible wiring substrate and a length of the wiring of a second flexible wiring substrate, and further, it is possible to reduce a difference between a length of the wiring for connecting the fourth substrate and first driving module to each other and a length of the wiring for connecting the fifth substrate and the second driving module to each other with respect to a difference between a length of the wiring of the third flexible wiring substrate and a length of the wiring of the fourth flexible wiring substrate.

Therefore, in the wiring for transferring the signal branched by the first substrate to the first driving module and the wiring for transferring the signal to the second driving module, it is possible to improve accuracy of the length of the wiring to be used near the first driving module and the second driving module. Therefore, even in a case where a wiring having a fine wire diameter is used in order to correspond to the nozzles provided with a high density of 300 or more per one inch as the wiring connected to the first driving module and the second driving module, it is possible to reduce the influence of a wiring impedance, and to reduce variations in the discharge characteristics of the first driving module and the second driving module.

Application Example 12

In the head unit according to the application example, the first substrate may have a ninth terminal and transfer a driving signal for displacing at least one of the first piezoelectric element and the second piezoelectric element and a control signal for controlling the driving signal, from the ninth terminal to the first terminal and the second terminal.

In the head unit according to the application example, in the first substrate, the driving signal and the control signal are respectively branched and transferred to the first terminal and the second terminal. In this manner, by branching and transferring the driving signal and the control signal in the first substrate, it is possible to reduce the interference of the disturbance noise with the driving signal and the control signal, and to improve the discharge accuracy.

Application Example 13

In the head unit according to the application example, the driving signal and the control signal may be transferred to the second substrate and the third substrate.

In the head unit according to the application example, the driving signal and the control signal are branched and transferred to a path for the supply to the second substrate via the first terminal and the first flexible wiring substrate and a path for the supply to the third substrate via the second terminal and the second flexible wiring substrate, in the first substrate. In this manner, by branching each of the driving signal and the control signal by the first substrate and transferring the driving signal and the control signal to the second substrate and the third substrate, the current based on the driving signal and the control signal that flow in the first flexible wiring substrate, and the current based on the driving signal and the control signal that flow in the second flexible wiring substrate can be reduced to be smaller than the current input to the first substrate (head unit). Therefore, even in a case where the wire diameters of the wirings of the first flexible wiring substrate and the second flexible wiring substrate is small, it is possible to supply sufficient electric power for driving the plurality of piezoelectric elements.

Application Example 14

In the head unit according to the application example, the driving signal and the control signal may be transferred to the fourth substrate and the fifth substrate.

In the head unit according to the application example, the driving signal and the control signal may be transferred to the fourth substrate and supplied to the first driving module via the fourth substrate, and further, may be transferred to the fifth substrate and supplied to the second driving module via the fifth substrate. By transferring the driving signal and the control signal to the fourth substrate and the fifth substrate, it is possible to select the amount of current to be supplied, the size or structure of the liquid flow passage, the length and the number of wirings that correspond to the environment, to improve the degree of freedom of design, and to improve versatility.

Application Example 15

In the head unit according to the application example, one or a plurality of each of the second substrate, the third substrate, the fourth substrate, and the fifth substrate may be provided, the total number of the second substrates and the third substrates may be greater than the number of the first substrates, and the total number of the fourth substrates and the fifth substrates may be greater than the total number of the second substrates and the third substrates.

In the head unit according to the application example, the input signal is branched by the first substrate, a part of the branched signal is transferred to the first driving module via the second substrate and the fourth substrate, and another part of the branched signal is transferred to the second driving module via the third substrate and the fifth substrate. Therefore, by increasing the total number of the second substrates and the third substrates with respect to the first substrates, it is possible to reduce the current that flows in one of the first flexible wiring substrate and the second flexible wiring substrate to be smaller than the current input to the first substrate, and further, by increasing the total number of the fourth substrates and the fifth substrates with respect to the total number of the second substrates and the third substrates, it is possible to reduce the current that flows in one of the third flexible wiring substrate and the fourth flexible wiring substrate to be smaller than the current that flows in one of the first flexible wiring substrate and the second flexible wiring substrate.

In this manner, by branching the current and reducing the current that flows in one flexible wiring substrate, it is possible to reduce heat generation of the flexible wiring substrate and to supply sufficient electric power for driving all of the plurality of piezoelectric elements.

Application Example 16

In the head unit according to the application example, an outer wall portion that surrounds the second substrate and the first flexible wiring substrate may further be provided, and a distance between the second substrate and the outer wall portion may be smaller than a distance between the first flexible wiring substrate and the outer wall portion.

In the head unit according to the application example, by providing the second substrate between the first flexible wiring to which the signal is transferred and the outer wall portion, it is possible to protect the first flexible wiring which is relatively likely to be influenced by the disturbance noise by the second substrate. Accordingly, it is possible to reduce the interference of the noise with the signal transmitted by the first flexible wiring substrate, for example, when the signal transferred by the first flexible wiring substrate is the driving signal and the control signal, it is possible to improve the discharge accuracy of the liquid discharged from the first driving module.

Application Example 17

In the head unit according to the application example, the outer wall portion may surround the third substrate and the second flexible wiring substrate, and a distance between the third substrate and the outer wall portion may be smaller than a distance between the second flexible wiring substrate and the outer wall portion.

In the head unit according to the application example, by providing the third substrate between the second flexible wiring to which the signal is transferred and the outer wall portion, it is possible to protect the second flexible wiring which is relatively likely to be influenced by the disturbance noise by the third substrate. Accordingly, it is possible to reduce the interference of the noise with the signal transmitted by the second flexible wiring substrate, for example, when the signal transferred by the second flexible wiring substrate is the driving signal and the control signal, it is possible to improve the discharge accuracy of the liquid discharged from the second driving module.

Application Example 18

In the head unit according to the application example, the outer wall portion may surround the fourth substrate and the third flexible wiring substrate, and a distance between the fourth substrate and the outer wall portion may be smaller than a distance between the third flexible wiring substrate and the outer wall portion.

In the head unit according to the application example, by providing the fourth substrate between the third flexible wiring to which the signal is transferred and the outer wall portion, it is possible to protect the third flexible wiring which is relatively likely to be influenced by the disturbance noise by the fourth substrate. Accordingly, it is possible to reduce the interference of the noise with the signal transmitted by the third flexible wiring substrate, for example, when the signal transferred by the third flexible wiring substrate is the driving signal and the control signal, it is possible to improve the discharge accuracy of the liquid discharged from the first driving module.

Application Example 19

In the head unit according to the application example, the outer wall portion may surround the fifth substrate and the fourth flexible wiring substrate, and a distance between the fifth substrate and the outer wall portion may be smaller than a distance between the fourth flexible wiring substrate and the outer wall portion.

In the head unit according to the application example, by providing the fifth substrate between the fourth flexible wiring to which the signal is transferred and the outer wall portion, it is possible to protect the fourth flexible wiring which is relatively likely to be influenced by the disturbance noise by the fourth substrate. Accordingly, it is possible to reduce the interference of the noise with the signal transmitted by the fourth flexible wiring substrate, for example, when the signal transferred by the fourth flexible wiring substrate is the driving signal and the control signal, it is possible to improve the discharge accuracy of the liquid discharged from the second driving module.

BRIEF DESCRIPTION OF THE DRAWINGS

The invention will be described with reference to the accompanying drawings, wherein like numbers reference like elements.

FIG. 2 is a side view illustrating a schematic configuration of the liquid discharge apparatus.

DESCRIPTION OF EXEMPLARY EMBODIMENTS

Figure 1:
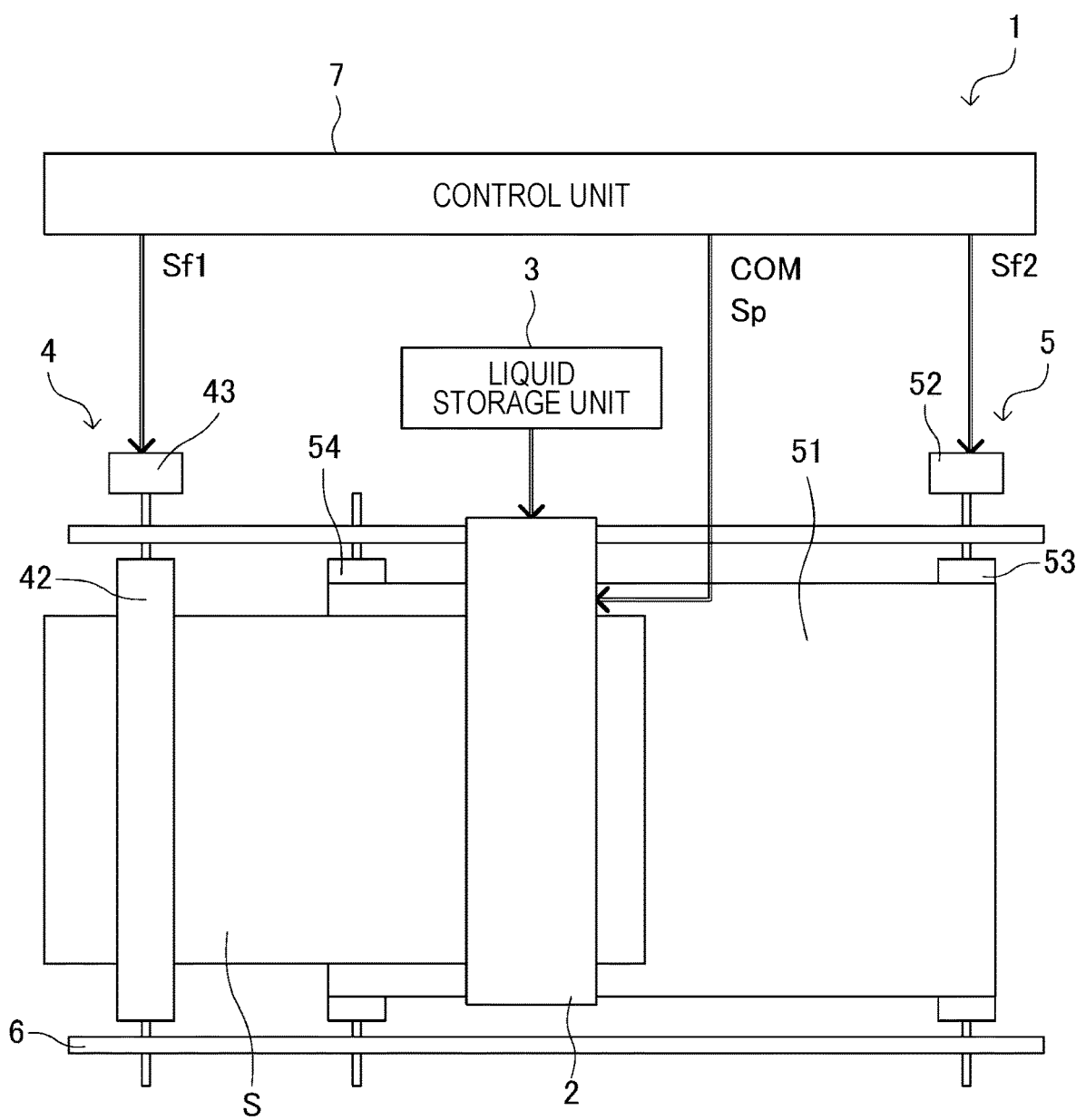
FIG. 1 is a top view illustrating a schematic configuration of a liquid discharge apparatus.

Hereinafter, appropriate embodiments of the invention will be described with reference to the drawings. The drawing to be used is for convenience of description. In addition, the embodiments which will be described below do not inappropriately limit the contents of the invention described in the claims. In addition, not all of the configurations which will be described below are necessarily essential components of the invention.

Hereinafter, a head unit according to the invention will be described using a head unit employed to a liquid discharge apparatus that is a printing apparatus as an example.

First Embodiment

1. Configuration of Liquid Discharge Apparatus 1

FIG. 1 is a top view illustrating a schematic configuration of a liquid discharge apparatus 1 according to a first embodiment. In addition, FIG. 2 is a side view illustrating a schematic configuration of the liquid discharge apparatus 1. The liquid discharge apparatus 1 is a so-called line type ink jet type recording apparatus that performs printing only by transporting a recording sheet S that is a recording medium.

In the first embodiment, in the liquid discharge apparatus 1, a direction in which the recording sheet S is transported is as a direction Y, a direction which is orthogonal to the direction Y and parallel to a surface of the recording sheet S is a direction X, a direction which is perpendicular to a plane (X-Y plane) parallel to the surface of the recording sheet S and in which ink (liquid) is discharged from a nozzle of a print head 2 is a direction Z. In addition, in the direction Y, an upstream side of a transport direction of the recording sheet S is a Y1 side and a downstream side is a Y2 side. Furthermore, in the direction Z, the print head 2 side is a Z1 side and the recording sheet S side is a Z2 side. In addition, in the first embodiment, a relationship of each direction (X, Y, and Z) is described as directions orthogonal to each other, but a disposition relationship of each configuration is not necessarily limited to the directions orthogonal to each other.

The liquid discharge apparatus 1 includes the print head 2, a liquid storage unit 3, a transport unit 4, a transport unit 5, an apparatus main body 6, and a control unit 7.

The control unit 7 includes a processing circuit, such as a central processing unit (CPU) or a field programmable gate array (FPGA), and a memory circuit, such as a semiconductor memory, and controls each element of the liquid discharge apparatus 1 based on information input from an external device, such as a host computer. In addition, in the first embodiment, the control unit 7 is fixed to the apparatus main body 6.

The control unit 7 generates a transport control signal Sf1 for transporting the recording sheet S and outputs the transport control signal Sf1 to a driving motor 43 of the transport unit 4. In addition, the control unit 7 generates a transport control signal Sf2 for transporting the recording sheet S and outputs the transport control signal Sf2 to a driving motor 52 of the transport unit 5. In addition, the control unit 7 generates a plurality of signals including a driving signal COM for discharging the liquid by being applied to a piezoelectric element 610 which will be described later, and a discharge control signal Sp (one example of "control signal") for controlling the application of the driving signal COM to the piezoelectric element 610, and outputs the signals to the print head 2.

The liquid storage unit 3 is configured with a tank or the like in which the ink is stored a liquid, and in the first embodiment, the liquid storage unit 3 is fixed to the apparatus main body 6. The ink is supplied from the liquid storage unit 3 to the print head 2 via a supply tube, such as a tube.

The print head 2 discharges the ink supplied from the liquid storage unit 3 onto the recording sheet S based on the driving signal COM and the discharge control signal Sp which are input from the control unit 7. In addition, the print head 2 will be described in detail later.

The transport unit 4 is provided on the Y1 side of the print head 2. The transport unit 4 includes a transport roller 41 and a driven roller 42.

The transport roller 41 is provided on a rear surface S2 side opposite to a landing surface S1 on which the ink of the recording sheet S lands, and is driven by a driving force of the driving motor 43 driven based on the transport control signal Sf1 input from the control unit 7. In addition, the driven roller 42 is provided on the landing surface S1 side of the recording sheet S, and is driven by the transport roller 41 by sandwiching the recording sheet S between the transport roller 41 and the driven roller 42. At this time, the driven roller 42 presses the recording sheet S toward the transport roller 41 side by a biasing member of a spring or the like (not illustrated).

The transport unit 5 is provided on the Y2 side of the transport unit 4 and includes a transport belt 51, a driving motor 52, a transport roller 53, a driven roller 54, and a tension roller 55.

The transport roller 53 is driven by the driving force of the driving motor 52 to be driven based on the transport control signal Sf2 input from the control unit 7. The transport belt 51 is an endless belt, and is hung at an outer circumference of the transport roller 53 and the driven roller 54. The transport belt 51 is provided on the rear surface S2 side of the recording sheet S. The tension roller 55 is provided between the transport roller 53 and the driven roller 54, abuts against the inner circumferential surface of the transport belt 51, and applies a tension to the transport belt 51 by a biasing force of a biasing member 56, such as a spring. Accordingly, it is possible to flatten a surface that opposes the print head 2 between the transport roller 53 and the driven roller 54 in the transport belt 51.

In the liquid discharge apparatus 1, based on the signal output from the control unit 7, while transporting the recording sheet S from the Y1 side to the Y2 side of the print head 2 by the transport unit 4 and the transport unit 5, by discharging the ink from the print head 2 and by landing the discharged ink onto the landing surface S1 of the recording sheet S, printing is performed. In addition, the transport unit in the liquid discharge apparatus 1 is not limited to the above-described configuration of the transport unit 4 and the transport unit 5, but may be a unit configured with a so-called drum or a unit equipped with a platen. In addition, in the first embodiment, a description will be made with a line type ink jet type recording apparatus, but a so-called serial type ink jet type recording apparatus in which the print head 2 moves perpendicularly to the transport direction of the recording sheet S may be employed.

2. Structure View of Print Head

Figure 3:
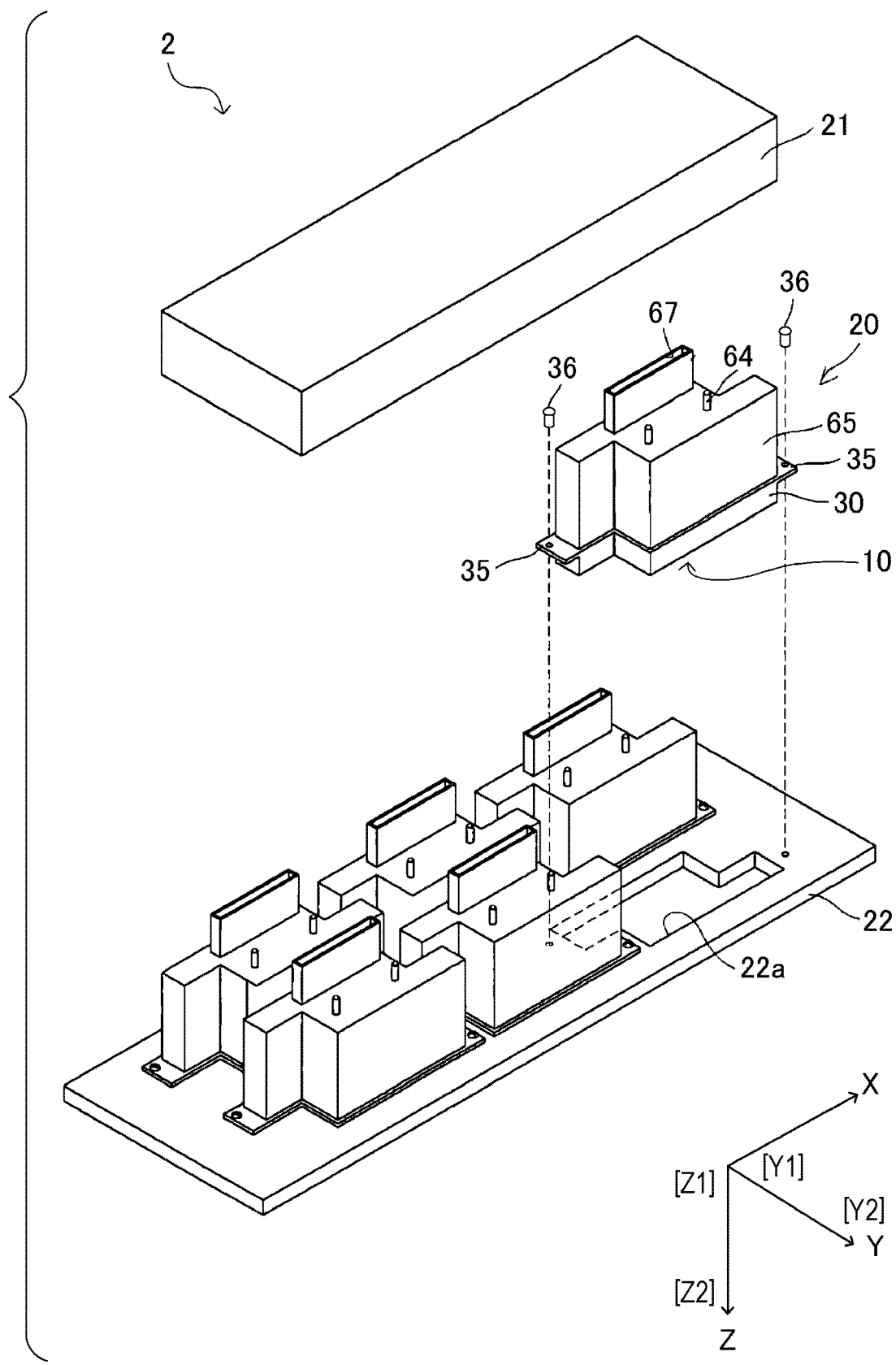
FIG. 3 is an exploded perspective view of a print head.
Figure 4:
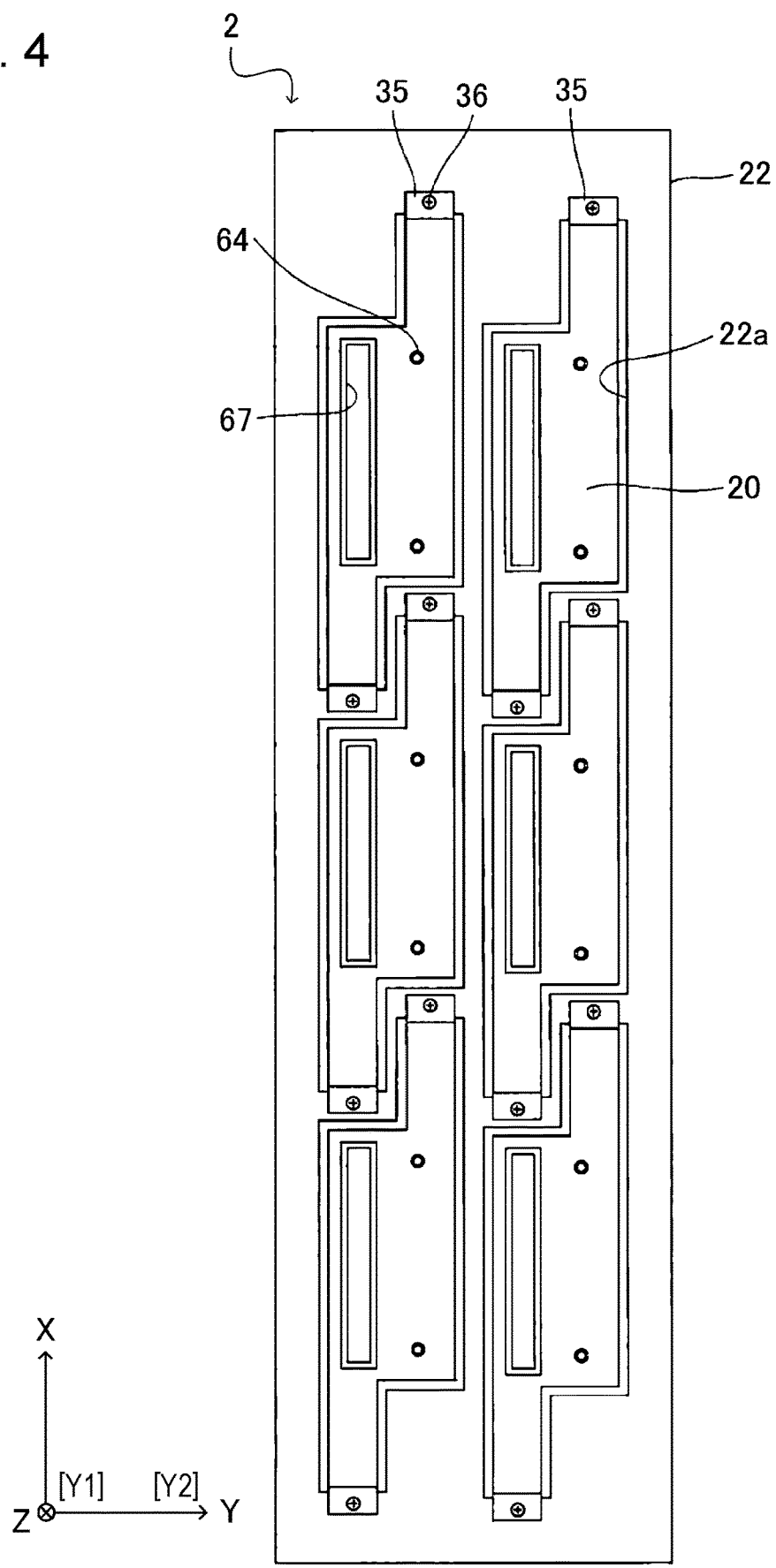
FIG. 4 is a top view of the print head.

Here, a structure of the print head 2 will be described with reference to FIGS. 3 and 4. FIG. 3 is an exploded perspective view of the print head 2. In addition, FIG. 4 is a top view of the print head 2. Further, in FIG. 4, a supply member 21 included in the print head 2 is omitted.

The print head 2 includes a plurality of head units 20, the supply member 21, and a supporting body 22.

As illustrates in FIGS. 3 and 4, the plurality of head units 20 are held by the supporting body 22 configured with a plate-like member formed of a conductive material, such as metal. Specifically, three head units 20 are juxtaposed in the direction X, and the juxtaposed rows are provided in two rows in the direction Y.

In detail, in the supporting body 22, a supporting hole 22a for holding each of the head units 20 is provided, and the head unit 20 is held in a state where a discharge surface 10 which is a surface that opposes the recording sheet S from the supporting hole 22a. The head unit 20 includes a holder 30 that holds a driving module 100 which will be described later. On both sides in the direction X of the holder 30, a flange portion 35 is provided integrally with the holder 30. The flange portion 35 and the supporting body 22 are fixed to each other by a fixing screw 36. In addition, the supporting hole 22a may be provided continuously over the plurality of head units 20.

Furthermore, a supply member 21 for supplying the ink to the plurality of held head units 20 is connected to the supporting body 22. The supply member 21 is connected to a supply pipe, such as a tube to which the ink is supplied, from the liquid storage unit 3. In other words, the ink is supplied to each of the plurality of head units 20 from the liquid storage unit 3 via the supply member 21.

Further, the head unit 20 includes a cover member 65 on the Z1 side of the holder 30.

The cover member 65 has a configuration for protecting a plurality of circuit substrates or wirings, or an ink flow passage, which are provided on the inside of the head unit 20. The cover member 65 includes: a connection opening portion 67 for inputting the plurality of signals including the driving signal COM and the discharge control signal Sp which are output from the control unit 7, to the head unit 20; and a supply unit 64 to which the ink is supplied from the supply member 21.

3. Configuration of Head Unit

Here, a configuration of the head unit 20 in the first embodiment will be described with reference to FIGS. 5 to 7.

Figure 5:
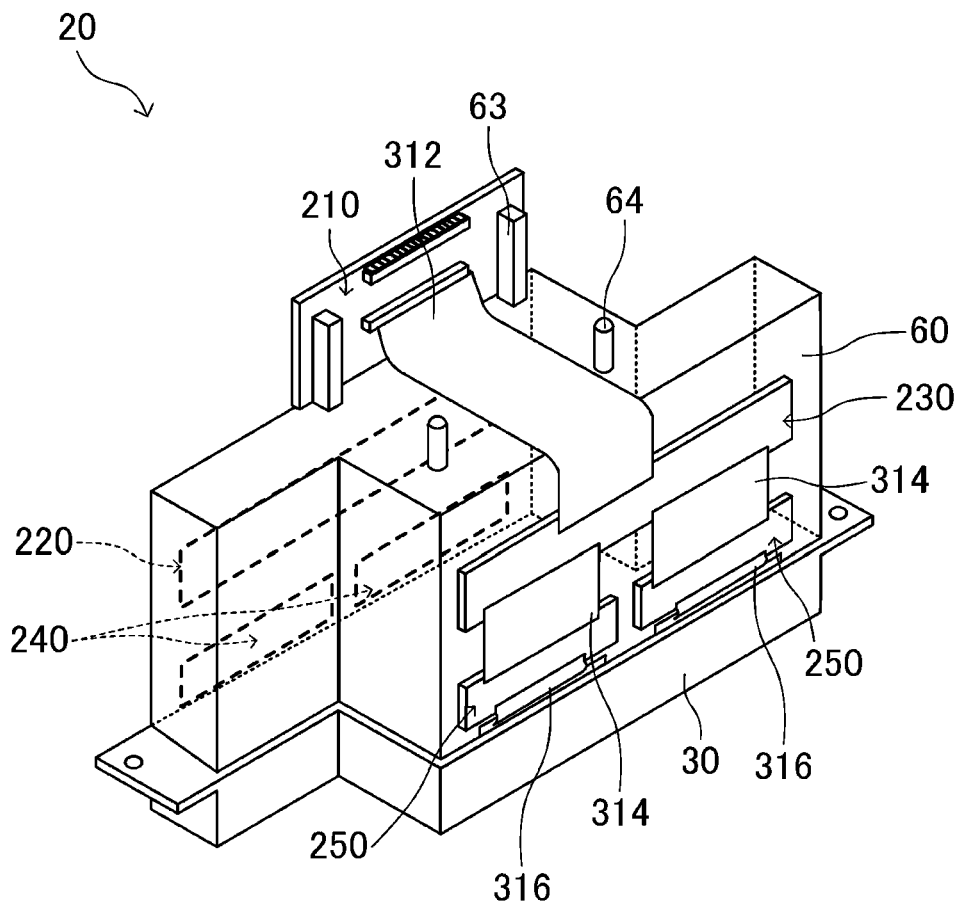
FIG. 5 is a perspective view of a head unit of a first embodiment.

FIG. 5 is a perspective view of the head unit 20. In FIG. 5, the cover member 65 of the head unit 20 is omitted, and the inside of the cover member 65 is illustrated. Furthermore, in FIG. 5, a substrate unit 220 and a substrate unit 240 which are provided on the Y1 side of a flow passage member 60 included in the head unit 20 are indicated by broken lines. FIG. 6 is an exploded perspective view of the head unit 20 when viewed from the discharge surface 10. FIG. 7 is a view illustrating the discharge surface 10 of the head unit 20.

Figure 6:
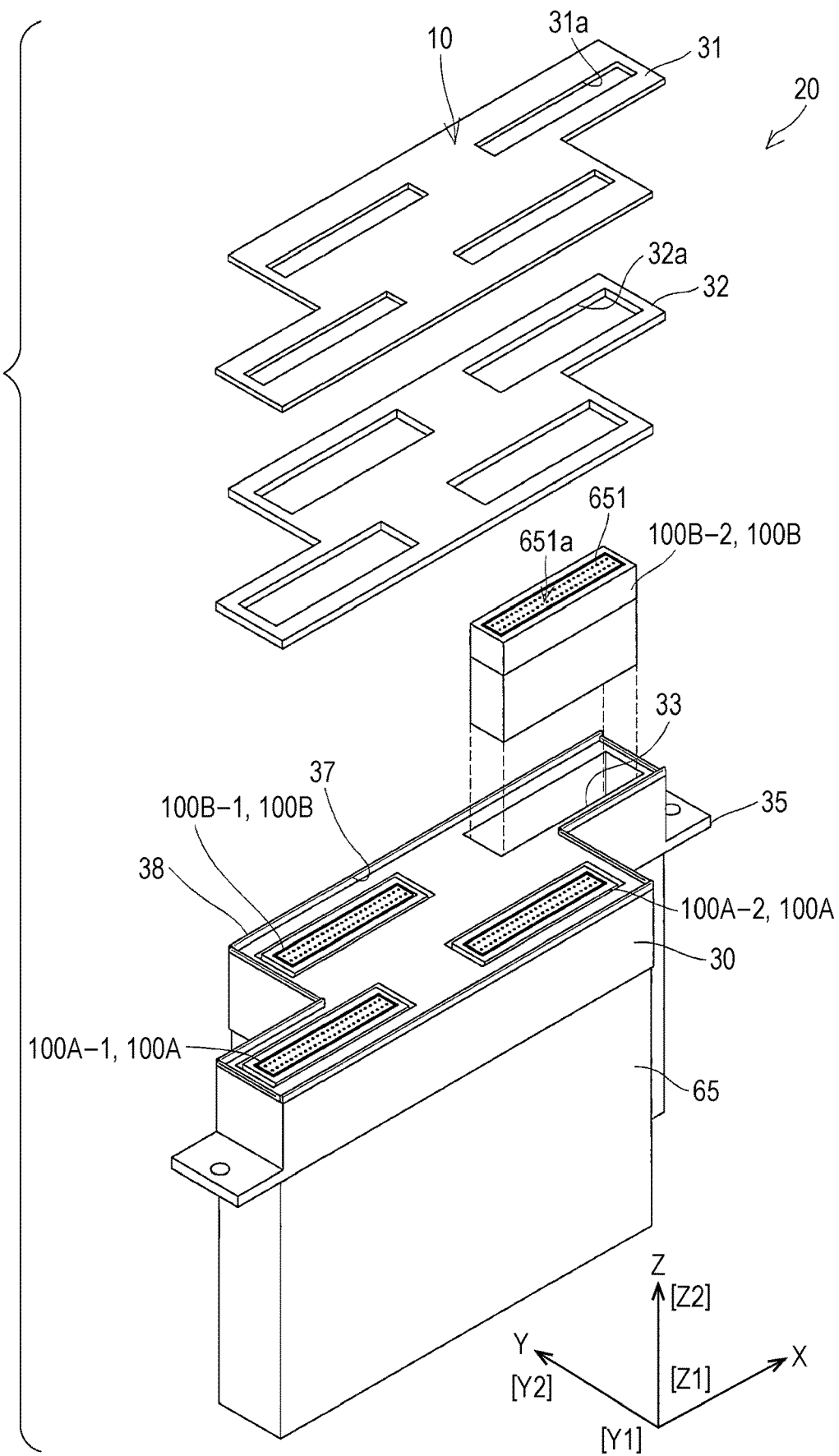
FIG. 6 is an exploded perspective view of the head unit of the first embodiment.

As illustrated in FIG. 6, the head unit 20 includes a holder 30, a fixing plate 31, a reinforcing plate 32, a cover member 65, driving modules 100A-1 and 100A-2, and driving modules 100B-1 and 100B-2. In addition, as illustrated in FIG. 5, on an inner side of the cover member of the head unit 20, a flow passage member 60 and substrate units 210, 220, 230, 240, and 250 are provided.

In addition, the driving modules 100A-1, 100A-2, 100B-1, and 100B-2 have the same configuration, and when it is not necessary to distinguish, the driving modules 100A-1 and 100A-2 are a driving module 100A (one example of "first driving module"), and the driving modules 100B-1 and 100B-2 are referred to as a driving module 100B (one example of "second driving module") in some cases. Furthermore, when it is not necessary to distinguish the driving module 100A from the driving module 100B, the driving module 100A and the driving module 100B are collectively referred to as the driving module 100 in some cases.

As illustrated in FIG. 6, the holder 30 is made of a conductive material, such as metal having a higher strength than that of the fixing plate 31. An accommodation unit 33 that accommodates a plurality of driving modules 100 therein is provided on the surface on the Z2 side of the holder 30. The accommodation unit 33 has a recessed shape that is open to the Z2 side and accommodates the plurality of driving modules 100 fixed by the fixing plate 31 therein. At this time, the opening of the accommodation unit 33 is sealed by the fixing plate 31. In other words, the driving module 100 is accommodated on the inside of a space formed by the accommodation unit 33 and the fixing plate 31. In addition, the accommodation unit 33 may be provided for each of the driving modules 100, or may be provided continuously over the plurality of driving modules 100.

In addition, in the holder 30, the driving module 100 is disposed in a zigzag manner along the direction X. Specifically, the driving modules 100A-1 and 100A-2 are provided along the direction X on the Y1 side of the holder 30, and the driving modules 100B-1 and 100B-2 are provided along the direction X on the Y2 side of the holder 30. The driving modules 100A-1 and 100A-2 and the driving modules 100B-1 and 100B-2 are disposed being shifted in the direction X.

A recess portion 37 having a recessed shape to which the reinforcing plate 32 and the fixing plate 31 are fixed is provided on the surface on the Z2 side on which the accommodation unit 33 of the holder 30 is provided. In other words, the outer circumferential edge portion on the Z2 side of the holder 30 is an edge portion 38 provided so as to protrude to the Z2 side, and the recess portion 37 is formed by the edge portion 38 that protrudes to the Z2 side. The reinforcing plate 32 and the fixing plate 31 are sequentially stacked on a bottom surface of the recess portion 37.

The fixing plate 31 is configured with a plate-like member formed of a conductive material, such as metal. In addition, an opening portion 31a that exposes a nozzle surface 651a (refer to FIG. 7) provided with nozzles 651 of each of the driving modules 100 is provided on the fixing plate 31 so as to penetrate in the direction Z. The opening portion 31a of the first embodiment is provided independently for each of the driving modules 100. In addition, the fixing plate 31 is fixed to the nozzle surface 651a side of the driving module 100 in the circumferential edge portion of the opening portion 31a.

It is preferable that the reinforcing plate 32 be made of a material having a higher strength than that of the fixing plate 31. An opening portion 32a having an inner diameter greater than the outer circumference of the driving module 100 is provided on the reinforcing plate 32 so as to penetrate in the direction Z corresponding to the driving module 100 joined to the fixing plate 31. The driving module 100 inserted into the opening portion 32a of the reinforcing plate 32 is joined to the surface on the Z1 side of the fixing plate 31.

The fixing plate 31 and the holder 30 are pressed against each other and joined to each other at a predetermined pressure in a state where the surface on the Z2 side of the fixing plate 31 is supported by a supporting tool (not illustrated).

The cover member 65 is provided on the Z1 side of the holder 30, and protects a plurality of circuit substrates or wirings, or the ink flow passage, which are provided on the inside of the head unit 20. In other words, the cover member 65 is provided so as to surround the substrate units 210, 220, 230, 240, and 250 and the flow passage member 60 which are illustrated in FIG. 5.

Figure 7:
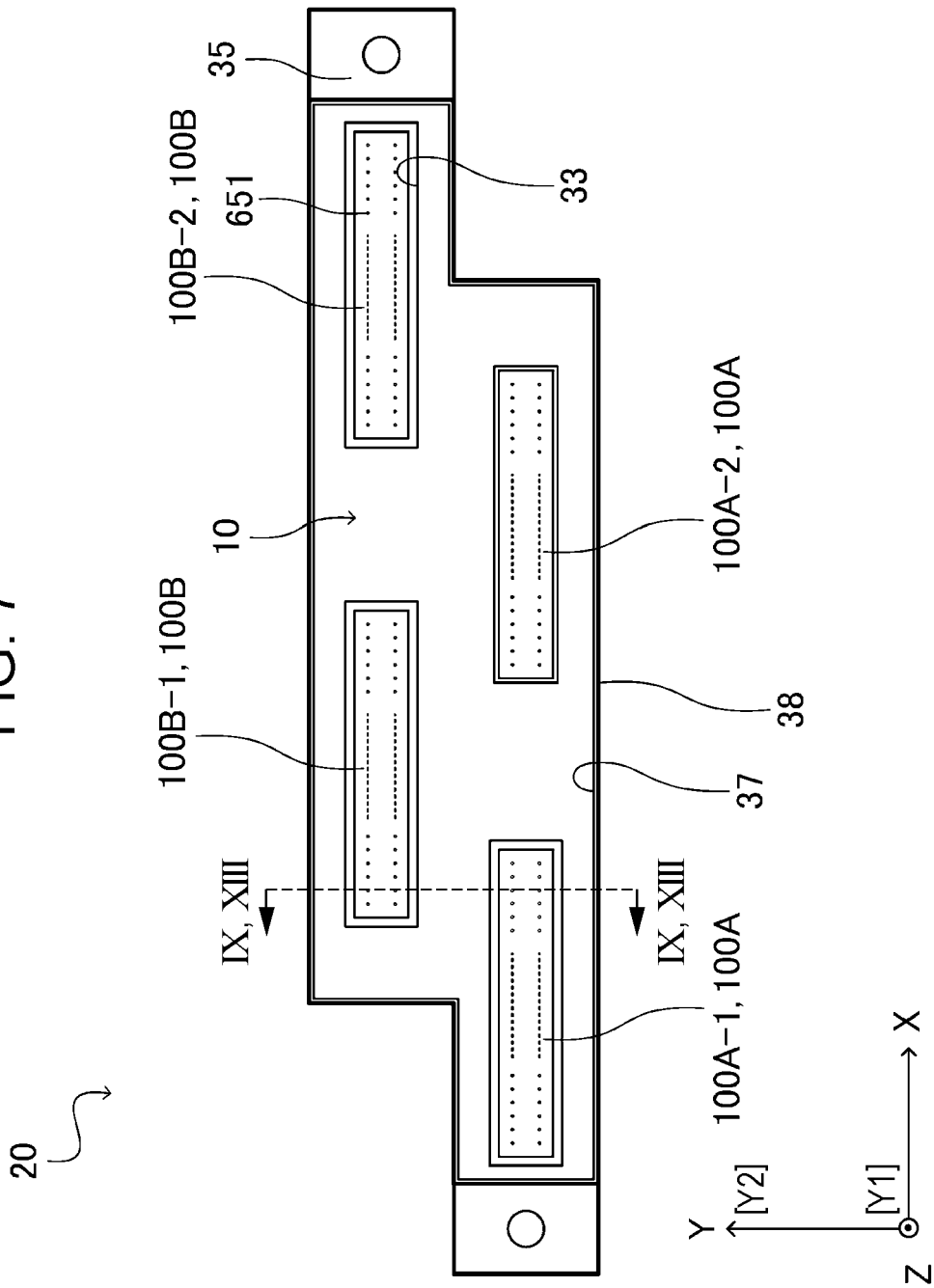
FIG. 7 is a view illustrating a discharge surface of the head unit of the first embodiment.

As illustrated in FIG. 7, in the driving module 100, nozzles 651 for discharging the ink are juxtaposed along the direction X. In addition, in the first embodiment, in the driving module 100, a plurality of rows, in the embodiment, two rows in which the nozzles 651 are juxtaposed in the direction X are provided in the direction Y. In addition, in the first embodiment, in the driving module 100, 300 or more nozzles 651 are juxtaposed per one inch along the direction X, and further, 600 or more nozzles 651 are provided in one driving module 100. Here, the surface on which the nozzle 651 of the driving module 100 is provided is referred to as the nozzle surface 651a. In other words, the discharge surface 10 of the head unit 20 includes a plurality of nozzle surfaces 651a on which the nozzles 651 of the driving module 100 are formed.

On the inside of the driving module 100, a flow passage that communicates with the nozzle 651 and a pressure generating unit that generates a pressure change in the ink in the flow passage are provided.

As illustrated in FIG. 5, the flow passage member 60 is fixed to the inner side of the cover member 65, that is, to the Z1 side of the holder 30. The flow passage member 60 is provided with an ink flow passage (not illustrated) for supplying the ink supplied from the supply unit 64 to the driving module 100. The ink flow passage is provided with a filter for removing foreign substances, such as dust or air bubbles contained in the ink, a pressure adjusting valve for opening and closing in accordance with the pressure of the flow passage on the downstream side, and the like.

Further, the substrate unit 210 which stands upright on the support unit 63 is provided on the Z1 side of the flow passage member 60, the substrate units 220 and 240 are provided on the surface on the Y1 side of the flow passage member 60, and the substrate units 230 and 250 are provided on the surface on the Y2 side of the flow passage member 60.

In addition, the disposition of the flow passage member 60, the substrate units 210, 220, 230, 240, and 250, and the driving module 100 will be described in detail later.

4. Configuration of Discharge Unit Included in Driving Module

Figure 8:
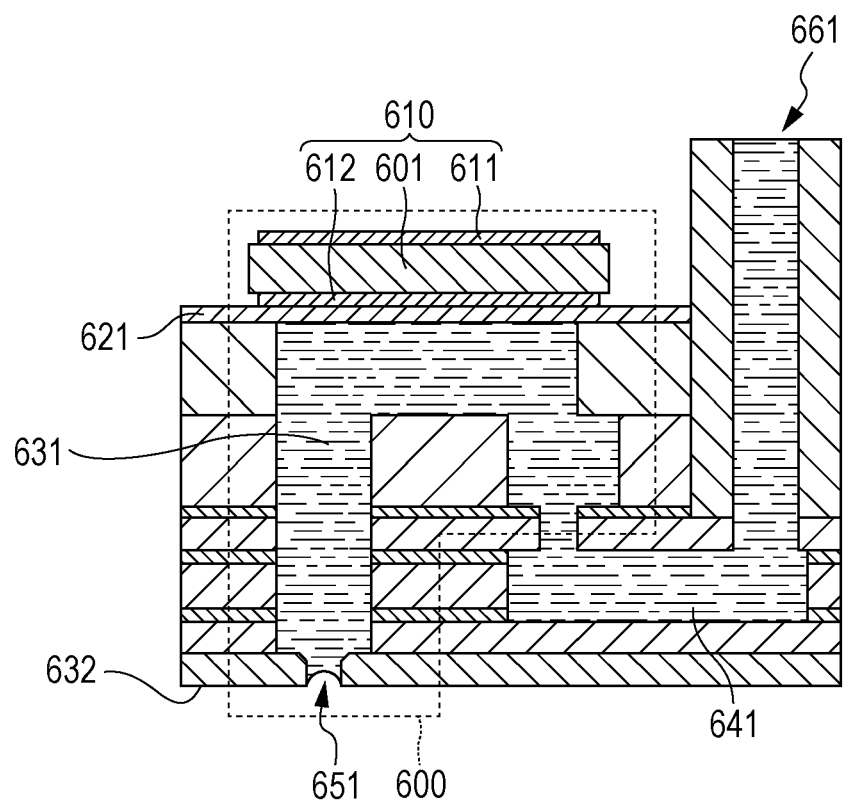
FIG. 8 is a view for describing a configuration and an operation of a discharge unit included in a driving module.

Here, an operation of discharging the ink from the driving module 100 will be described with reference to FIG. 8. FIG. 8 is a view for describing a configuration and an operation of a discharge unit 600 including the nozzle 651 included in the driving module 100.

In the first embodiment, each of the driving modules 100A and 100B includes: a plurality of piezoelectric elements 610 (one example of "first piezoelectric element" and "second piezoelectric element"); a plurality of cavities 631 (one example of "first cavity" and "second cavity") associated with the plurality of piezoelectric elements 610; and the plurality of nozzles 651 (one example of "first nozzle" and "second nozzle") associated with the plurality of cavities 631.

An internal volume of the plurality of cavities 631 changes due to the displacement of the piezoelectric elements 610 with which each of the cavities 631 is associated.

In addition, the plurality of nozzles 651 discharge the liquid in accordance with the change in the internal volume of the cavity 631 with which each of the nozzles 651 is associated.

Specifically, as illustrated in FIG. 8, the driving module 100 includes the discharge unit 600 that corresponds to each of the plurality of nozzles 651 and a reservoir 641.

The ink is introduced into the reservoir 641 from a supply port 661 via the flow passage member 60.

The discharge unit 600 includes the piezoelectric element 610, a diaphragm 621, the cavity 631, and the nozzle 651. Among the members, the diaphragm 621 functions as a diaphragm that is displaced (bending vibration) by the piezoelectric element 610 provided on the upper surface in FIG. 8, and enlarges and reduces the internal volume of the cavity 631 filled with the ink. The nozzle 651 is an aperture which is provided on the nozzle plate 632 on which the nozzle surface 651a is formed and communicates with the cavity 631. The inside of the cavity 631 is filled with the ink, and the internal volume changes due to the displacement of the piezoelectric element 610.

The nozzle 651 communicates with the cavity 631 and discharges the ink in the cavity 631 as a liquid droplet in accordance with the change in the internal volume of the cavity 631.

The piezoelectric element 610 has a structure in which a piezoelectric body 601 is nipped between one pair of electrodes 611 and 612. In the piezoelectric body 601 having the structure, in accordance with a voltage (driving signal COM) applied by the electrodes 611 and 612, the center part in FIG. 8 together with the electrodes 611 and 612 and the diaphragm 621 is bent in an up-down direction with respect to both end parts. Specifically, when the voltage of the driving signal COM applied to the piezoelectric element 610 increases, the center part is bent in an upward direction, and when the voltage of the driving signal COM decreases, the center part is bent in a downward direction. In the configuration, since the internal volume of the cavity 631 expands when the center part bends in the upward direction, the ink is drawn from the reservoir 641. Meanwhile, since the internal volume of the cavity 631 decreases when the center part is bent in the downward direction, the ink is discharged from the nozzle 651 as much as the decrease in the internal volume.

Therefore, a set of the piezoelectric element 610, the cavity 631, and the nozzle 651 is provided for each of the nozzles 651.

The head unit 20 in the first embodiment includes four driving modules 100A-1, 100A-2, 100B-1, and 100B-2. In other words, 2400 or more nozzles 651 in total are provided with a density of 300 or more per one inch, and further, the same number of cavities 631 and piezoelectric elements 610 as that of the nozzles 651 are provided.

In addition, the piezoelectric element 610 is not limited to the illustrated structure and may have any type as long as the piezoelectric element 610 can be deformed and the liquid, such as ink, can be discharged. Further, the piezoelectric element 610 is not limited to bending vibration, and may employ a configuration in which so-called longitudinal vibration is used.

5. Disposition of Substrate Units, Flow Passage, and Driving Module in Head Unit The disposition of the flow passage member 60, the substrate units 210, 220, 230, 240, and 250, and the driving module 100 which are included in the head unit 20 will be described in detail with reference to FIGS. 5 and 9. FIG. 5 is a perspective view of the head unit 20 as described above, and FIG. 9 is a sectional view taken along the line IX-IX of FIG. 7.

Figure 9:
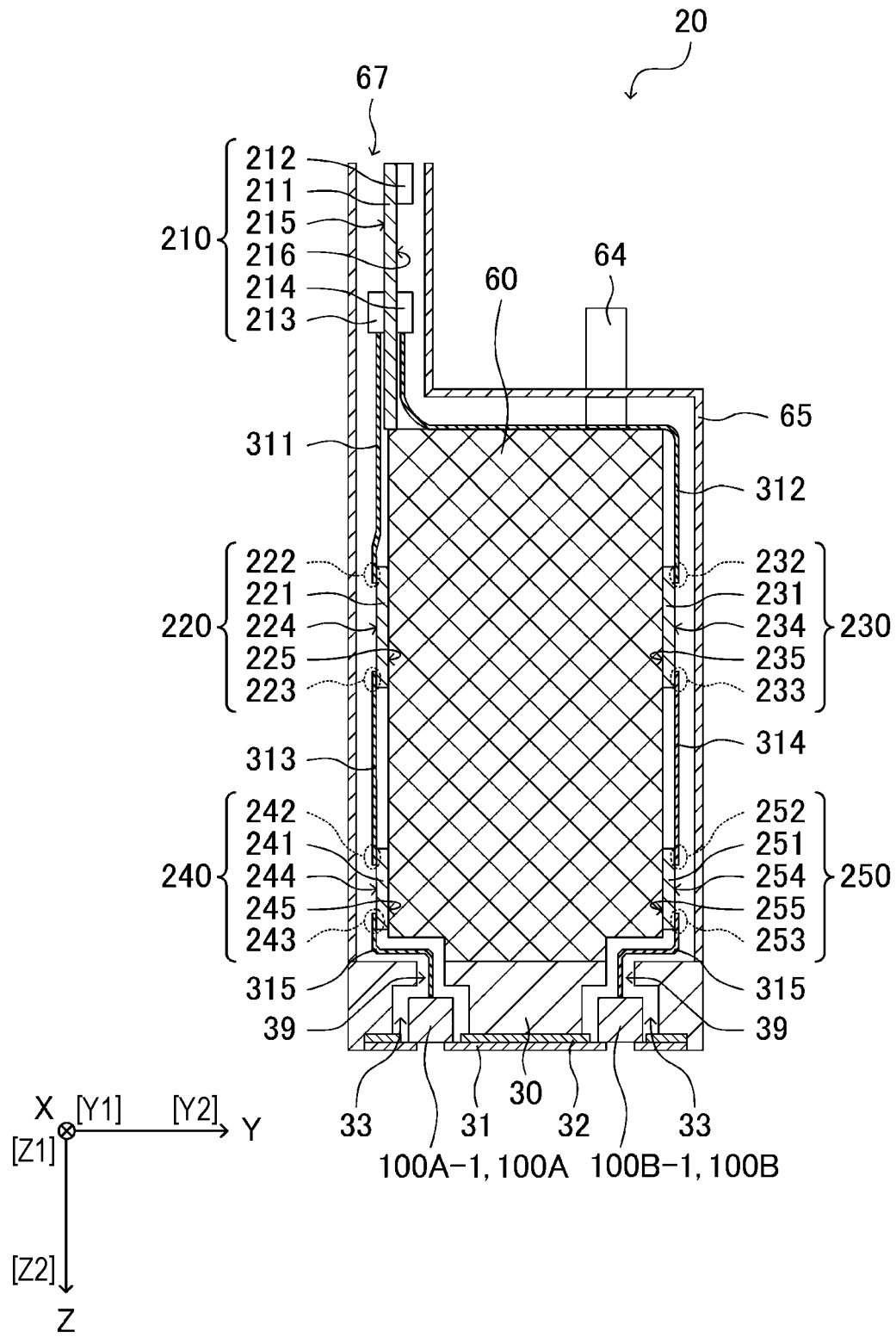
FIG. 9 is a sectional view taken along the line IX-IX of the head unit of the first embodiment.

As illustrated in FIGS. 5 and 9, in the head unit in the first embodiment, the flow passage member 60 is disposed between the substrate unit 220 and the substrate unit 230. Furthermore, the substrate unit 210 stands upright to be positioned on the Z1 side (upper side in FIG. 9) of the flow passage member 60, that is, on the substrate unit 220 side.

In addition, on the Z2 side (lower side in FIG. 9) of the flow passage member 60, the driving module 100A which is electrically connected to the substrate unit 220 is positioned on the substrate unit 220 side, and the driving module 100B which is electrically connected to the substrate unit 230 is positioned on the substrate unit 230 side.

More specifically, the substrate unit 210 includes a substrate 211 (one example of "first substrate"). A connecting connector 213 (one example of "first terminal") is provided on a surface 215 of the substrate 211, and a connecting connector 214 (one example of "second terminal") is provided on a surface 216.

The substrate unit 220 includes a substrate 221 (one example of "second substrate"). On a surface 224 of the substrate 221, a connection unit 222 (one example of "third terminal") and a connection unit 223 (one example of "fifth terminal") are provided, and the connection unit 222 is connected to the connecting connector 213 by a wiring substrate 311 (one example of "first flexible wiring substrate").

The substrate unit 240 includes a substrate 241 (one example of "fourth substrate"). On a surface 244 of the substrate 241, a connection unit 242 (one example of "sixth terminal") and a connection unit 243 are provided, and the connection unit 242 is connected to the connection unit 223 by a wiring substrate 313 (one example of "third flexible wiring substrate"). In addition, a wiring substrate 315 is connected to the connection unit 243 and is connected to the driving module 100A-1. In other words, the driving module 100A is electrically connected to the substrate 221 via the substrate 241.

The substrate unit 230 includes a substrate 231 (one example of "third substrate"). On a surface 234 of the substrate 231, a connection unit 232 (one example of "fourth terminal") and a connection unit 233 (one example of "seventh terminal") are provided, and the connection unit 232 is connected to the connecting connector 214 by a wiring substrate 312 (one example of "second flexible wiring substrate").

The substrate unit 250 includes a substrate 251 (one example of "fifth substrate"). On a surface 254 of the substrate 251, a connection unit 252 (one example of "eighth terminal") and a connection unit 253 are provided, and the connection unit 252 is connected to the connection unit 233 by a wiring substrate 314 (one example of "fourth flexible wiring substrate"). In addition, a wiring substrate 316 is connected to the connection unit 253 and is connected to the driving module 100B-1. In other words, the driving module 100B is electrically connected to the substrate 231 via the substrate 251.

At this time, an ink flow passage (one example of "liquid flow passage") provided in the flow passage member 60 for supplying the ink to the driving module 100A and the driving module 100B is positioned between the substrate 221 and the substrate 231.

In addition, the surface 215 and the surface 216 of the substrate 211, the surface 224 of the substrate 221, and the surface 234 of the substrate 231 are respectively positioned along the direction Z (one example of "direction in which the liquid is discharged from the first nozzle or the second nozzle"), and further, the substrate 211 is positioned further on the substrate 221 side than the substrate 231 in the direction X (when viewed from the direction X) which is the direction intersecting with the direction Z.

Accordingly, it is possible to provide the flow passage member 60 for supplying the ink to the driving modules 100A and 100B on the intermediate point between the driving module 100A and the driving module 100B, and to smoothly supply the ink from the flow passage member 60 to the driving modules 100A and 100B. Furthermore, in the first embodiment, by providing the substrate 211 on the substrate 221 side of the flow passage member 60, it is possible to smoothly supply the ink from the flow passage member 60 to the driving modules 100A and 100B.

Furthermore, by providing the surface 224 of the substrate 221 and the surface 234 of the substrate 231 along the direction Z, it is possible to ensure a wide ink flow passage provided in the flow passage member 60. Accordingly, even in a case where the head unit 20 is provided with the plurality of driving modules 100 including 600 or more nozzles 651 with a density of 300 or more per one inch, it is possible to reduce variations in the ink pressure.

Here, the disposition of the flow passage member 60, the substrate units 210, 220, 230, 240, and 250, and the driving module 100 which are included in the head unit 20 will be described in more detail with reference to FIGS. 5 and 9.

The substrate unit 210 includes the substrate 211, an input connector 212, the connecting connector 213, and the connecting connector 214.

The substrate 211 is provided in the support unit 63 provided on the Z1 side of the flow passage member 60 along the direction Z such that the surface 215 is on the Y1 side and the surface 216 is on the Y2 side. At this time, when viewed from the X direction, the substrate 211 is positioned on the Y1 side of the surface on the Z1 side of the flow passage member 60, that is, further on the substrate unit 220 side than the substrate unit 230 which will be described later.

The connecting connector 213 is provided on the surface 215, and the input connector 212 and the connecting connector 214 are provided on the surface 216. Furthermore, on the substrate 211, although not illustrated, a plurality of wirings or vias for electrically connecting the input connector 212 and each of the connecting connectors 213 and 214 to each other are provided.

In addition, on the substrate 211, when the signal input from the control unit 7 is a differential signal, such as a low voltage differential signaling (LVDS) transfer method, a low voltage positive emitter coupled logic (LVPECL) transfer method, or a current mode logic (CML) transfer method, in addition to the above-described configuration, the circuit (for example, a signal restoring IC) for restoring the differential signal may be provided.

The input connector 212 (one example of "ninth terminal") has one or a plurality of electrodes, and is electrically connected to the control unit 7 as the wiring (not illustrated) is connected thereto through the connection opening portion 67 provided in the cover member 65. Accordingly, the plurality of signals including the driving signal COM and the discharge control signal Sp which are output from the control unit 7 are input to the substrate unit 210. The plurality of signals including the input driving signal COM and the discharge control signal Sp are branched by the plurality of wirings or vias provided on the substrate 211, and transferred to the connecting connectors 213 and 214.

Each of the connecting connectors 213 and 214 has one or the plurality of electrodes and outputs the signal branched by the substrate 211. Specifically, the connecting connector 213 is connected to the wiring substrate 311, and outputs the plurality of signals including the driving signal COM and the discharge control signal Sp to the substrate unit 220. Meanwhile, the connecting connector 214 is connected to the wiring substrate 312, and outputs the plurality of signals including the driving signal COM and the discharge control signal Sp to the substrate unit 230.

At this time, it is preferable that the connecting connector 213 provided on the surface 215 of the substrate 211 and the connecting connector 214 provided on the surface 216 be disposed to oppose each other via the substrate 211. Furthermore, it is preferable that one or a plurality of electrodes included in the connecting connector 213 disposed to oppose each other and one or a plurality of electrodes included in the connecting connector 214 be electrically connected to each other through the via or the like in a region where the electrodes oppose each other via the substrate 211.

In this manner, as the connecting connector 213 and the connecting connector 214 are disposed to oppose each other via the substrate 211 and are connected by vias, it is possible to shorten the wiring that connects the connecting connector 213 and the connecting connector 214 to each other, and to reduce impedance of the wiring. Accordingly, the variations caused by the wiring impedance of the signal output from the connecting connector 213 and the signal output from the connecting connector 214 are reduced.

As described above, the substrate unit 210 (substrate 211) includes the input connector 212, and transfers the driving signal COM for displacing (driving) the piezoelectric element 610 and the discharge control signal Sp for controlling the driving signal COM from the input connector 212 to the connecting connector 213 and the connecting connector 214.

The substrate unit 220 includes the substrate 221, the connection unit 222, and the connection unit 223.

The substrate 221 is provided along the direction Z such that the surface 224 is on the Y1 side and the surface 225 is on the Y2 side, on the side surface on the Y1 side of the flow passage member 60. On the substrate 221, the connection unit 222 and the connection unit 223 are provided, and further, although not illustrated, the plurality of wirings or vias for electrically connecting the connection unit 222 and the connection unit 223 to each other are provided.

The connection unit 222 has one or a plurality of electrodes, is provided on the surface 224 of the substrate 221, and is electrically connected to the wiring substrate 311. Accordingly, the connecting connector 213 and the connection unit 222 are electrically connected to each other, and the plurality of signals including the driving signal COM and the discharge control signal Sp which are output from the substrate unit 210 are transferred to the substrate unit 220. The plurality of signals including the transferred driving signal COM and the discharge control signal Sp are transferred to the connection unit 223 through the plurality of wirings or vias provided on the substrate 221.

The connection unit 223 has one or a plurality of electrodes and is electrically connected to the wiring substrate 313 provided on the surface 224 of the substrate 221. In addition, the plurality of connection units 223 may be provided on the surface 224 of the substrate 221, and specifically, the same number of connection units 223 as that of the substrate units 240 which will be described later is preferable. Therefore, the plurality of wirings or vias provided on the substrate 221 include wirings and vias for branching the plurality of signals including the driving signal COM and the discharge control signal Sp to each of the plurality of connection units 223.

As described above, the driving signal COM and the discharge control signal Sp are transferred from the substrate unit 210 (substrate 211) to the substrate unit 220 (substrate 221).

Each of the plurality of substrate units 240 includes the substrate 241, the connection unit 242, and the connection unit 243. In addition, in the head unit 20 in the first embodiment, two substrate units 240 juxtaposed in the direction X are provided, but the number of the substrate units 240 is not limited to two, and one or three or more substrate units 240 may be juxtaposed.

The substrate 241 is a side surface on the Y1 side of the flow passage member 60 and is provided along the direction Z such that the surface 244 is on the Y1 side and the surface 245 is on the Y2 side, on the Z2 side of the substrate unit 220. On the substrate 241, the connection unit 242 and the connection unit 243 are provided, and further, although not illustrated, the plurality of wirings or vias for electrically connecting the connection unit 242 and the connection unit 243 to each other are provided.

The connection unit 242 has one or a plurality of electrodes, is provided on the surface 244 of the substrate 241, and is electrically connected to the wiring substrate 313. Accordingly, the connection unit 223 and the connection unit 242 are electrically connected to each other, and the plurality of signals including the driving signal COM and the discharge control signal Sp are transferred from the substrate unit 220 to the substrate unit 240. The plurality of signals including the transferred driving signal COM and the discharge control signal Sp are transferred to the connection unit 243 through the plurality of wirings or vias provided on the substrate 241.

The connection unit 243 has one or a plurality of electrodes and is electrically connected to the wiring substrate 315 provided on the surface 244 of the substrate 241.

As described above, the driving signal COM and the discharge control signal Sp are transferred from the substrate unit 220 (substrate 221) to the substrate unit 240 (substrate 241).

The driving module 100A is provided on the Z2 side of the flow passage member 60, that is, on the substrate unit 240 side.

Each of the two wiring substrates 315 connected to the connection unit 243 of the two substrate units 240 is electrically connected to the driving module 100A juxtaposed on the Y1 side of the head unit 20 in the driving module 100.

Accordingly, the connection unit 243 and the driving module 100A are electrically connected to each other, and the plurality of signals including the driving signal COM and the discharge control signal Sp are transferred to the driving module 100A. In addition, the driving module 100A drives the piezoelectric element 610 based on the plurality of signals including the input driving signal COM and the discharge control signal Sp and discharges the ink. In addition, the wiring substrate 315 that connects the substrate unit 240 and the driving module 100A to each other penetrates the holder 30 in the Z direction, and is connected to the accommodation unit 33 through a communication hole 39 that makes the wiring substrate 315 communicate with the Z1 side.

The substrate unit 230 includes the substrate 231, the connection unit 232, and the connection unit 233.

The substrate 231 is provided along the direction Z such that the surface 234 is on the Y2 side and the surface 235 is on the Y1 side, on the side surface on the Y2 side of the flow passage member 60. On the substrate 231, the connection unit 232 and the connection unit 233 are provided, and further, although not illustrated, the plurality of wirings or vias for electrically connecting the connection unit 232 and the connection unit 233 to each other are provided.

The connection unit 232 has one or a plurality of electrodes, is provided on the surface 234 of the substrate 231, and is electrically connected to the wiring substrate 312. Accordingly, the connecting connector 214 and the connection unit 232 are electrically connected to each other, and the plurality of signals including the driving signal COM and the discharge control signal Sp which are output from the substrate unit 210 are transferred to the substrate unit 230. The plurality of signals including the transferred driving signal COM and the discharge control signal Sp are transferred to the connection unit 233 through the plurality of wirings or vias provided on the substrate 231.

The connection unit 233 has one or a plurality of electrodes and is electrically connected to the wiring substrate 314 provided on the surface 234 of the substrate 231. In addition, the plurality of connection units 233 may be provided on the surface 234 of the substrate 231, and specifically, the same number of connection units 233 as that of the substrate units 250 which will be described later is preferable. Therefore, the plurality of wirings or vias provided on the substrate 231 include wirings and vias for branching the plurality of signals including the driving signal COM and the discharge control signal Sp to each of the plurality of connection units 233.

As described above, the driving signal COM and the discharge control signal Sp are transferred from the substrate unit 210 (substrate 211) to the substrate unit 230 (substrate 231).

Each of the plurality of substrate units 250 includes the substrate 251, the connection unit 252, and the connection unit 253. In addition, in the head unit 20 in the first embodiment, two substrate units 250 juxtaposed in the direction X are provided, but the number of the substrate units 250 is not limited to two, and one or three or more substrate units 250 may be juxtaposed.

The substrate 251 is a side surface on the Y2 side of the flow passage member 60 and is provided along the direction Z such that the surface 254 is on the Y2 side and a surface 255 is on the Y1 side, on the Z2 side of the substrate unit 230. On the substrate 251, the connection unit 252 and the connection unit 253 are provided, and further, although not illustrated, the plurality of wirings or vias for electrically connecting the connection unit 252 and the connection unit 253 to each other are provided.

The connection unit 252 has one or a plurality of electrodes, is provided on the surface 254 of the substrate 251, and is electrically connected to the wiring substrate 314. Accordingly, the connection unit 233 and the connection unit 252 are electrically connected to each other, and the plurality of signals including the driving signal COM and the discharge control signal Sp are transferred from the substrate unit 230 to the substrate unit 250. The plurality of signals including the transferred driving signal COM and the discharge control signal Sp are transferred to the connection unit 253 through the plurality of wirings or vias provided on the substrate 251.

The connection unit 253 has one or a plurality of electrodes and is electrically connected to the wiring substrate 316 provided on the surface 254 of the substrate 251.

As described above, the driving signal COM and the discharge control signal Sp are transferred from the substrate unit 230 (substrate 231) to the substrate unit 250 (substrate 251).

The driving module 100B is provided on the Z2 side of the flow passage member 60, that is, on the substrate unit 250 side.

The two wiring substrates 316 connected to the connection unit 253 of the two substrate units 250 is electrically connected to the driving module 100B juxtaposed on the Y2 side of the head unit 20 in the driving module 100.

Accordingly, the connection unit 253 and the driving module 100B are electrically connected to each other, and the plurality of signals including the driving signal COM and the discharge control signal Sp are transferred to the driving module 100B. In addition, the driving module 100B drives the piezoelectric element 610 based on the plurality of signals including the input driving signal COM and the discharge control signal Sp and discharges the liquid. In addition, the wiring substrate 316 that connects the substrate unit 250 and the driving module 100B to each other penetrates the holder 30 in the Z direction, and is connected to the accommodation unit 33 through a communication hole 39 that makes the wiring substrate 316 communicate with the Z1 side.

In addition, as the wiring substrates 311, 312, 313, 314, 315, and 316, it is possible to use a flexible sheet-like member, for example, a chip on film substrate (COF). Further, for example, the wiring substrate may be a flexible flat cable (FFC) or flexible printed circuits (FPC).

Figure 10:
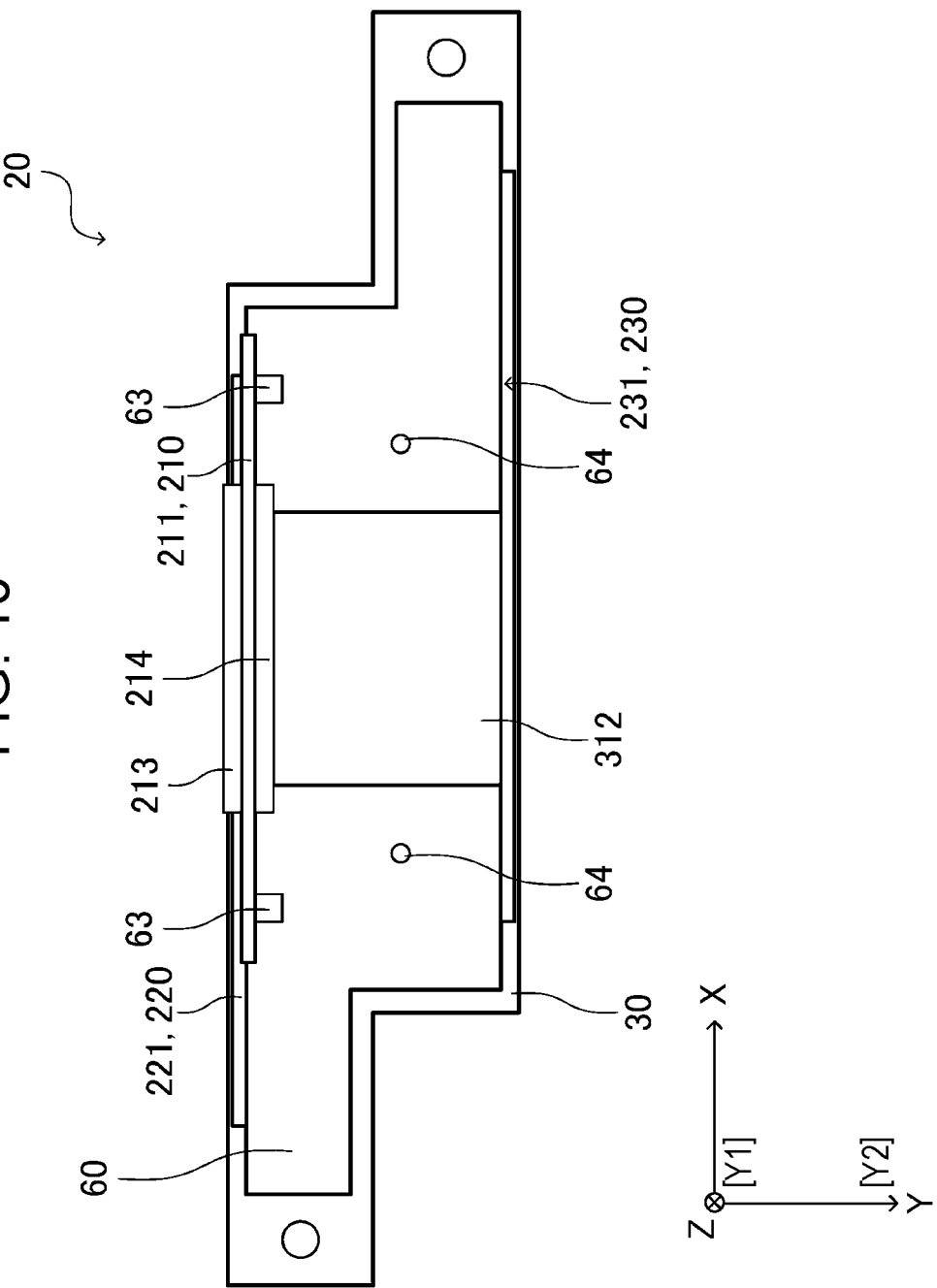
FIG. 10 is a top view of the head unit of the first embodiment.

In the head unit 20 in the first embodiment, as illustrated in FIG. 10, the substrate unit 210 and the substrate unit 220 are positioned in the direction Z (when viewed from the direction Z) such that at least one side of the substrate 211 overlaps at least one side of the substrate 221, and further, in the direction X intersecting with the direction Z (when viewed from the direction X), the ink flow passage included in the flow passage member 60, for example, the supply unit 64 is positioned further on the substrate 231 side than the substrate 211.

FIG. 10 is a top view of the head unit 20 when viewed from the Z1 side in the Z direction. In addition, in the head unit 20 illustrated in FIG. 10, the cover member 65 is omitted, and the inside of the cover member 65 is illustrated. In addition, in the head unit 20 illustrated in FIG. 10, the input connector 212 provided in the substrate unit 210 is also omitted.

As illustrated in FIG. 10, in the head unit 20 in the first embodiment, the substrate unit 210 is positioned so as to overlap the substrate unit 220 in the direction Z (when viewed from the direction Z), and accordingly, between the substrate unit 210 and the substrate unit 230, ideally, it is possible to provide the supply unit 64 which communicates with the ink flow passage of the flow passage member 60 in the vicinity of the center in the direction Y (when viewed from the direction Y) of the surface on the Z1 side of the flow passage member 60.

By providing the supply unit 64 in the vicinity of the center in the direction Y of the surface on the Z1 side of the flow passage member 60, it is possible to further widen the ink flow passage on the inside of the flow passage member 60 and to further smoothly supply the ink to the driving module 100. Accordingly, it is possible to further reduce the deviation of the pressure of the ink supplied to the driving module 100A disposed on the Y1 side of the head unit 20 and the driving module 100B disposed on the Y2 side.

Further, in the head unit 20, by providing the substrate unit 210 on the Y1 side of the flow passage member 60, it is possible to determine the up-down direction and the left-right direction of the head unit 20 with reference to the position of the substrate unit 210. In other words, even in a case of being used in the print head 2 on which the plurality of head units 20 are loaded as illustrated in FIGS. 3 and 4, by considering the input connector 212 (connection opening portion 67) of the substrate unit 210 provided in the head unit 20 as a reference of the up-down direction and the left-right direction, it is also possible to prevent the attachment error of the head unit 20.

In addition, in the head unit 20 in the first embodiment, the substrate unit 210 is provided on the surface on the Z1 side of the head unit 20, that is, on the Y1 side, but may also be received on the Y2 side, and at this time, the supply unit 64 may be provided on the Y1 side of the substrate unit 210 on the surface on the Z1 side of the head unit 20.

Figure 11:
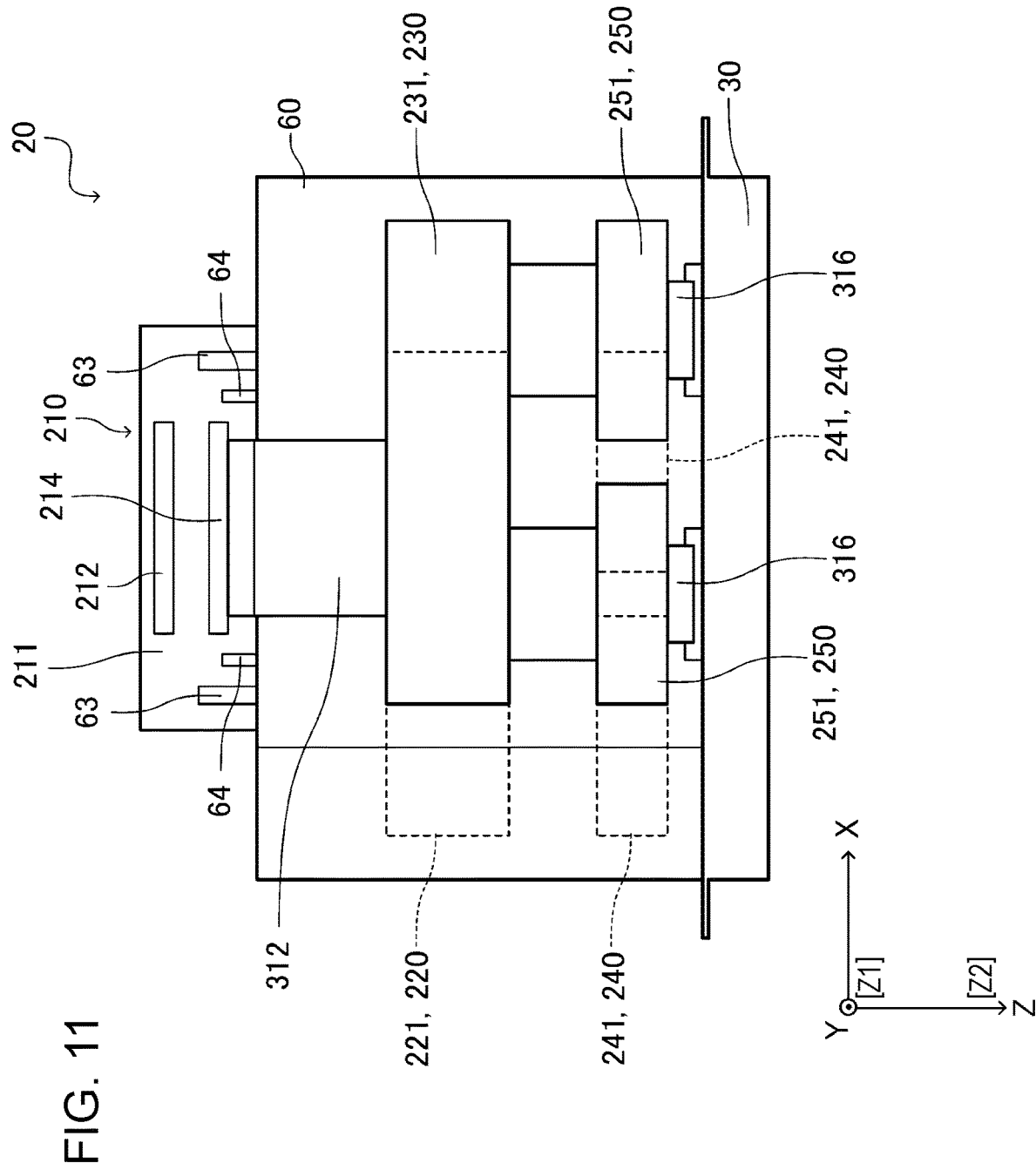
FIG. 11 is a side view of the head unit of the first embodiment.

In addition, in the head unit 20 in the first embodiment, as illustrated in FIG. 11, in the direction Y (when viewed from the direction Y) intersecting with the direction Z, the substrate 221 and the substrate 231 are positioned so as to overlap at least a part of the surface 224 and the surface 234, and further, the substrate 241 and the substrate 251 are positioned so as to overlap at least a part of the surface 244 and the surface 254.

FIG. 11 is a side view of the head unit 20 when viewed from the Y2 side in the direction Y. In addition, in the head unit 20 illustrated in FIG. 11, the cover member 65 is omitted, and the inside of the cover member 65 is illustrated. Further, in FIG. 11, the substrate units 220 (substrate 221) and 240 (substrate 241) provided on the side surface on the Y1 side of the flow passage member 60 are indicated by broken lines.

In this manner, the substrate unit 220 provided on the side surface on the Y1 side of the flow passage member 60 and the substrate unit 230 provided on the side surface on the Y2 side are disposed such that at least a part thereof overlaps in the direction Y. Furthermore, the substrate unit 240 provided on the side surface on the Y1 side of the flow passage member 60 and the substrate unit 250 provided on the side surface on the Y2 side are disposed such that at least a part thereof overlaps in the direction Y, and accordingly, it is possible to reduce the size of the head unit 20 in the direction Z and in the direction X. In other words, it is possible to reduce the size of the head unit 20.

Furthermore, by defining the distances (intervals) of each of the substrate units 210, 220, 230, 240, and 250 provided in the head unit 20, superimposition of the disturbance noise on the driving module 100 is reduced.

Specifically, the distance between the substrate 221 and the substrate 241 in the direction Z is greater than the distance between the driving module 100A and the substrate 241, and the distance between the substrate 211 and the substrate 221 is greater than the distance between the substrate 221 and the substrate 241. Furthermore, the distance between the substrate 231 and the substrate 251 in the direction Z is greater than the distance between the driving module 100B and the substrate 251, and the distance between the substrate 211 and the substrate 231 is greater than the distance between the substrate 231 and the substrate 251.

By positioning the members in this manner, it is possible to shorten the wiring substrate 313 with respect to the wiring substrate 311, and to shorten the wiring substrate 315 with respect to the wiring substrate 313. Furthermore, it is possible to shorten the wiring substrate 314 with respect to the wiring substrate 312, and to shorten the wiring substrate 316 with respect to the wiring substrate 314.

In addition, the difference between the distance between the substrate 221 and the substrate 241 and the distance between the substrate 231 and the substrate 251 is set to be greater than the difference between the distance between the substrate 241 and the driving module 100A and the distance between the substrate 251 and the driving module 100B, and the difference between the distance between the substrate 211 and the substrate 221 and the distance between the substrate 211 and the substrate 231 is set to be greater than the difference between the distance between the substrate 221 and the substrate 241 and the distance between the substrate 231 and the substrate 251.

Accordingly, it is possible to reduce the difference in length between the wiring substrate 313 and the wiring substrate 314 with respect to the difference in length between the wiring substrate 311 and the wiring substrate 312, and to reduce the difference in length between the wiring substrate 315 and the wiring substrate 316 with respect to the difference in length between the wiring substrate 313 and the wiring substrate 314.

In the first embodiment, the head unit 20 is provided with four driving modules 100 as described above, and each of the driving modules 100 has 600 or more nozzles 651 (piezoelectric elements 610).

Since the piezoelectric element 610 is electrically a capacitive load, a large current flows when the piezoelectric element 610 is driven (displaced). Therefore, an extremely large current is supplied to the multi-nozzle head unit 20 having 600 or more nozzles 651 together with the plurality of signals including the driving signal COM and the discharge control signal Sp. Furthermore, the current further increases in a case where driving signal COM drives the piezoelectric element 610 such that the ink is discharged at 16000 times or more (a frequency of 16 kHz or more) in 1 second in order to realize high-speed printing.

In the head unit 20 in the first embodiment, the total number of the substrates 221 and the substrates 231 is greater than the number of the substrates 211, and the total number of the substrates 241 and the substrates 251 is also greater than the total number of the substrates 221 and the substrates 231. Therefore, the plurality of signals including the driving signal COM and the discharge control signal Sp which are output from the control unit 7 are input via the input connector 212 included in the substrate unit 210. The input signal is branched by the substrate unit 210 and output from the connecting connectors 213 and 214. The signal output from the connecting connector 213 is further branched by the substrate unit 220, and then is input to the driving module 100A via the substrate unit 240. Meanwhile, the signal output from the connecting connector 214 is further branched by the substrate unit 230 and then input to the driving module 100B via the substrate unit 250.

The current that flows through the head unit 20 in this manner is branched by the substrate units 210, 220, and 230. In other words, the current that flows to each of the wiring substrates 311 and 312 is smaller than the current input to the head unit 20, and the current that flows in each of the wiring substrates 313, 314, 315, and 316 is smaller than the current that flows in each of the wiring substrates 311 and 312. Therefore, since heat generation caused by the currents of the wiring substrates 313, 314, 315, and 316 is reduced, it is possible to set the wiring diameters of each of the wiring substrates 313, 314, 315, and 316 to be smaller than the wiring diameters of the wiring substrates 311 and 312.

Meanwhile, as the flowing current decreases, the contribution by the impedance of the wiring increases, and there is a possibility that it is likely to be influenced by the disturbance noise or the like. Therefore, the lengths of the wiring substrates 313 and 315 are shortened with respect to the length of the wiring substrate 311, and the lengths of the wiring substrates 314 and 316 are shortened with respect to the length of the wiring substrate 312.

In addition, in the first embodiment, in the driving module 100, the nozzles 651 are juxtaposed with a density of 300 or more per one inch. Therefore, it is preferable that the wiring patterns of the wiring substrates 315 and 316 connected to the driving module 100 be also provided with a high density.

However, in order to provide the wiring patterns of the wiring substrates 315 and 316 with a high density, it is necessary to make the wiring pattern of the wiring narrow. However, in a case where the wiring pattern is narrowed, the impedance of the wiring increases, and it is likely to be influenced by the disturbance noise or the like. Here, in the head unit 20, in order to reduce the influence of the disturbance noise on the wiring substrates 315 and 316, the length of the wiring substrate 315 is shortened with respect to the length of the wiring substrate 313, and the length of the wiring substrate 316 is shortened with respect to the length of the wiring substrate 314. Accordingly, it is possible to reduce superimposition of the disturbance noise on each of the wiring substrates.

As the current that flows through each of the wiring substrates decreases, while it is possible to make the wiring width (wire diameter) narrow, the impedance of the wiring increases when the wiring pattern becomes narrow. In order to reduce the influence of the impedance, in the head unit 20, the difference in length between the wiring substrates 315 and 316 in which a narrower wiring pattern is used is set to be smaller than the difference in length between the wiring substrates 313 and 314, and further, the difference in length between the wiring substrates 313 and 314 is set to be smaller than the difference in length between the wiring substrates 311 and 312. Accordingly, it is possible to reduce the variations in signals generated in the plurality of signals including the driving signal COM and the discharge control signal Sp transferred on the Y1 side of the flow passage member 60, and the plurality of signals including the driving signal COM and the discharge control signal Sp transferred on the Y2 side, and to reduce the superimposition of the disturbance noise on each of the wiring substrates.

As described above, by providing the substrate units 210, 220, 230, 240, and 250, the ink is discharged from the nozzle 651 with a high frequency of 16 kHz or more, and even in a case of the head unit 20 in which the plurality of driving modules 100 in which 600 or more nozzles 651 are provided with a high density of 300 or more per one inch are provided, it is possible to reduce the influence of the disturbance noise or the like on each of the wiring substrates, and accordingly, it is possible to improve the discharge accuracy.

6. Operation and Effect

As described above, in the head unit 20 according to the first embodiment, by providing the flow passage member 60 between the substrate 221 connected to the driving module 100A and the substrate 231 connected to the driving module 100B, it is possible to provide an ink flow passage included in the flow passage member 60 for supplying the ink to the driving module 100A and the driving module 100B on the intermediate point between the driving module 100A and the driving module 100B. Accordingly, it is possible to smoothly supply the ink from the supply unit 64 to the driving modules 100A and 100B.

Furthermore, when the substrate 211 is viewed from the direction X intersecting with the direction Z, as the substrate 211 and the substrate 221 are provided to overlap each other when viewed from the substrate 221 side, ideally from the direction Z, it is possible to ensure a wide ink flow passage for supplying the ink to the driving modules 100A and 100B without interference by the substrate 211, and to more smoothly supply the ink to the driving modules 100A and 100B.

In this manner, in the head unit 20 of the first embodiment, it is possible to smoothly supply the ink from the supply unit 64 to the driving modules 100A and 100B, and to ensure a wide ink flow passage. Therefore, even in a case where the plurality of driving modules 100 including 600 or more nozzles 651 with a density of 300 or more per one inch are provided, it is possible to reduce variations in the ink pressure, and as a result, it is possible to improve discharge accuracy of the ink.

In addition, in the head unit 20 according to the first embodiment, the substrate 211 is connected to the substrate 221 which is electrically connected to the driving module 100A via the wiring substrate 311, and is also further electrically connected to the substrate 231 electrically connected to the driving module 100B via the wiring substrate 312. In other words, the substrate 211 branches the plurality of signals including the input driving signal COM and the discharge control signal Sp, and transfers the signals to each of the driving modules 100A and 100B.

Accordingly, it is possible to reduce the currents that flow through each of the wiring substrate 311 and the wiring substrate 312. Accordingly, in the head unit 20 in the first embodiment, the substrate 211 branches and transfers the plurality of signals including the driving signal COM and the discharge control signal Sp, and accordingly, even in a case where the plurality of driving modules 100 including 600 or more nozzles are provided, it is possible to supply sufficient electric power for driving (displacing) all of the plurality of piezoelectric elements 610 via the wiring substrate 311 and the wiring substrate 312.

Furthermore, by shortening the wiring substrate 313 with respect to the wiring substrate 311, by further shortening the wiring substrate 315 to be shorter than the wiring substrate 313, by shortening the wiring substrate 314 with respect to the wiring substrate 312, and by further shortening the wiring substrate 316 to be shorter than the wiring substrate 314, it is possible to reduce the contribution of the influence of the disturbance noise on the driving module, and to improve the discharge accuracy.

Second Embodiment

Hereinafter, the head unit 20 of a second embodiment will be described. The head unit 20 of the second embodiment will mainly describes the contents different from those of the first embodiment, and the description of contents that overlap those of the first embodiment will be omitted. In addition, in the head unit 20 of the second embodiment, the description will be made while the same reference numerals will be given to the same configuration elements as those of the first embodiment.

Figure 12:
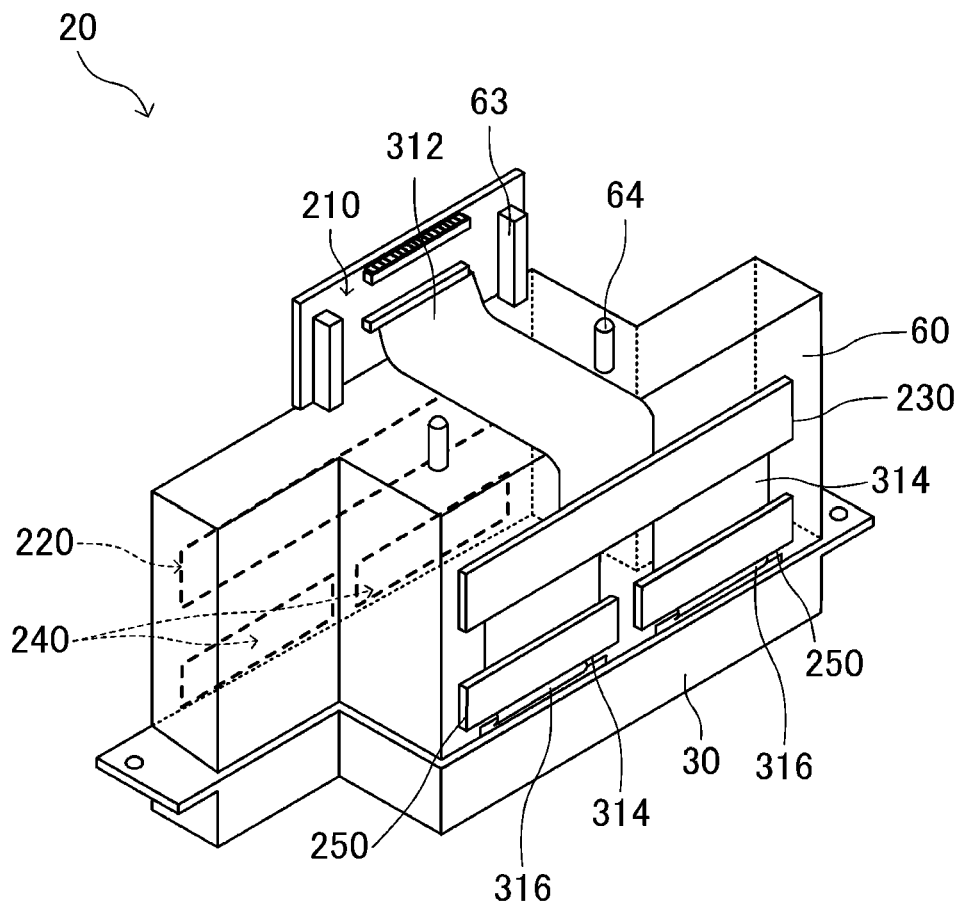
FIG. 12 is a perspective view of a head unit of a second embodiment.
Figure 13:
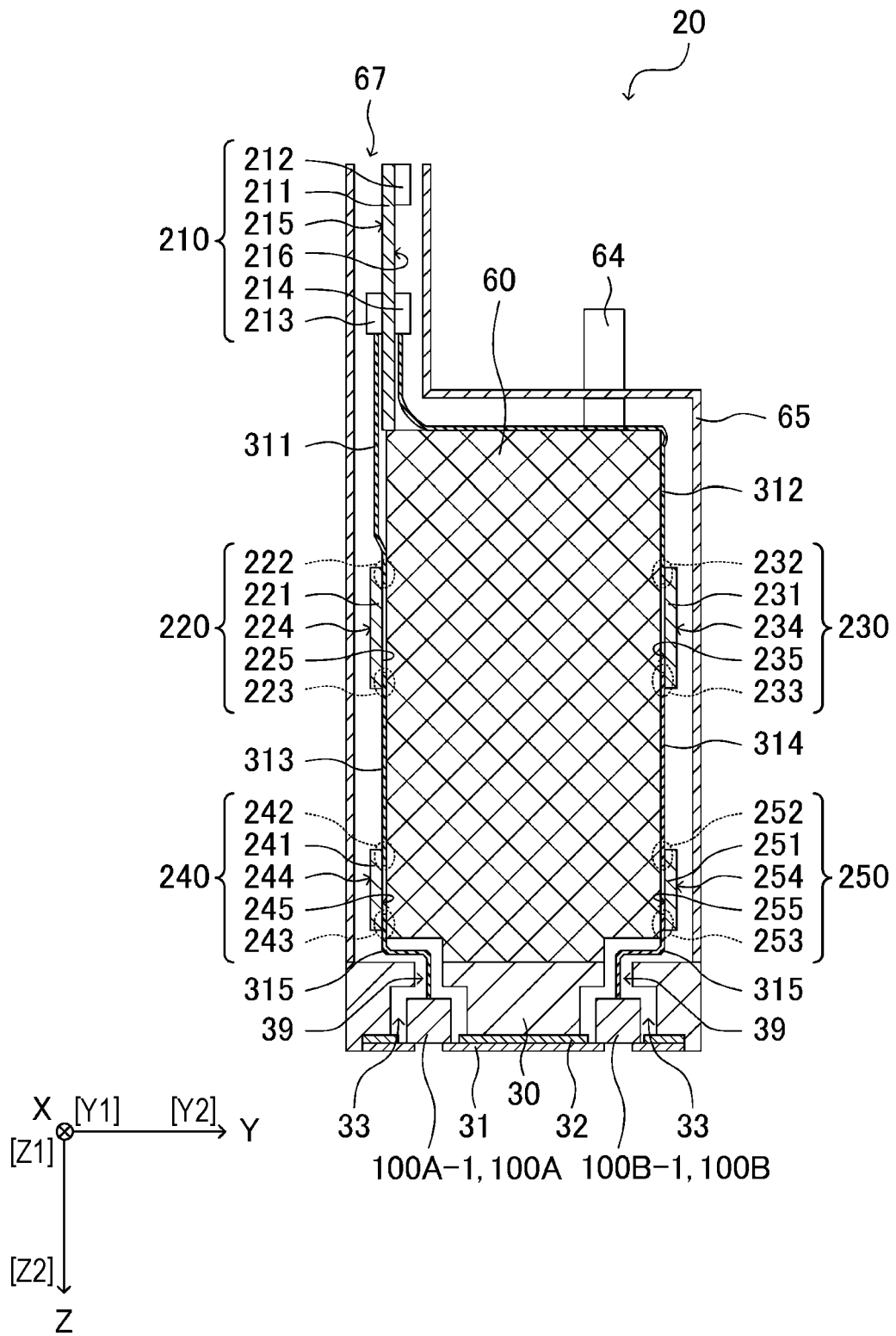
FIG. 13 is a sectional view taken along the line XIII-XIII of the head unit of the second embodiment.

FIG. 12 is a perspective view of the head unit 20 in the second embodiment. In addition, FIG. 13 is a sectional view taken along the line XIII-XIII of FIG. 7 in the second embodiment.

The head unit 20 of the second embodiment is different from that of the first embodiment in that the wiring substrates 311, 312, 313, 314, and 315 which connect the substrate units 220, 230, 240, and 250 to each other are provided between each of the substrate units 220, 230, 240, and 250 and the passage member 60.

Specifically, a part of the wiring substrate 311 is positioned between the substrate 221 and the ink flow passage included in the flow passage member 60, a part of the wiring substrate 312 is positioned between the substrate 231 and the ink flow passage included in the flow passage member 60, a part of the wiring substrate 313 is positioned between the substrate 241 and the ink flow passage included in the flow passage member 60, and a part of the wiring substrate 314 is positioned between the substrate 251 and the ink flow passage included in the flow passage member 60.

In other words, the distance between the substrate 221 and the cover member 65 (one example of "outer wall portion") is smaller than the distance between the wiring substrate 311 and the cover member 65, the distance between the substrate 231 and the cover member 65 is smaller than the distance between the wiring substrate 312 and the cover member 65, the distance between the substrate 241 and the cover member 65 is smaller than the distance between the wiring substrate 313 and the cover member 65, and the distance between the substrate 251 and the cover member 65 is smaller than the distance between the wiring substrate 314 and the cover member 65.

Specifically, as illustrated in FIGS. 12 and 13, similar to the first embodiment, the substrate unit 220 includes the substrate 221, the connection unit 222, and the connection unit 223, and is provided along the direction Z such that the surface 224 is the Y1 side and the surface 225 is the Y2 side, on the side surface on the Y1 side of the flow passage member 60.

The substrate 221 is provided with the connection unit 222 and the connection unit 223. In the second embodiment, the connection units 222 and 223 are provided on the surface 225 of the substrate 221. In addition, similar to the first embodiment, the connection unit 222 is electrically connected to the wiring substrate 311, and the connection unit 223 is electrically connected to the wiring substrate 313.

Similar to the first embodiment, the substrate unit 240 includes the substrate 241, the connection unit 242, and the connection unit 243, and is provided along the direction Z such that the surface 244 is the Y1 side and the surface 245 is the Y2 side, on the side surface on the Y1 side of the flow passage member 60, that is, on the Z2 side of the substrate unit 220.

The substrate 241 is provided with the connection unit 242 and the connection unit 243. In the second embodiment, the connection units 242 and 243 are provided on the surface 245 of the substrate 241. In addition, similar to the first embodiment, the connection unit 242 is electrically connected to the wiring substrate 313, and the connection unit 243 is electrically connected to the wiring substrate 315.

Similar to the first embodiment, the substrate unit 230 includes the substrate 231, the connection unit 232, and the connection unit 233, and is provided along the direction Z such that the surface 234 is the Y2 side and the surface 235 is the Y1 side, on the side surface on the Y2 side of the flow passage member 60.

The substrate 231 is provided with the connection unit 232 and the connection unit 233. In the second embodiment, the connection units 232 and 233 are provided on the surface 235 of the substrate 231. In addition, similar to the first embodiment, the connection unit 232 is electrically connected to the wiring substrate 312, and the connection unit 233 is electrically connected to the wiring substrate 314.

Similar to the first embodiment, the substrate unit 250 includes the substrate 251, the connection unit 252, and the connection unit 253, and is provided along the direction Z such that the surface 254 is the Y2 side and the surface 255 is the Y1 side, on the side surface on the Y2 side of the flow passage member 60, that is, on the Z2 side of the substrate unit 230.

The substrate 251 is provided with the connection unit 252 and the connection unit 253. In the second embodiment, the connection units 252 and 253 are provided on the surface 255 of the substrate 251. In addition, similar to the first embodiment, the connection unit 252 is electrically connected to the wiring substrate 314, and the connection unit 253 is electrically connected to the wiring substrate 316.

As described above, in the head unit 20 in the second embodiment, in addition to the effects described in the first embodiment, the wiring substrates 311, 312, 313, 314, and 315 which connect the substrate units 220, 230, 240, and 250 to each other are provided between each of the substrate units 220, 230, 240, and 250 and the flow passage member 60, and accordingly, it is possible to reduce adherence of the ink to each of the connection units 222, 223, 232, 233, 242, 243, 252, and 253, and to reduce the possibility of occurrence of electrolytic corrosion in each of the connection units 222, 223, 232, 233, 242, 243, 252, and 253.

Furthermore, in the head unit 20 in the second embodiment, when viewed from the Y direction, each of the substrate units 220, 230, 240, and 250 is disposed to be closer to the cover member 65 than the wiring substrates 311, 312, 313, 314, and 315. Therefore, it is possible to protect each of the wiring substrates 311, 312, 313, 314, and 315 which are relatively likely to be influenced by the disturbance noise from the disturbance noise by the substrate units 220, 230, 240, and 250, and for example, the interference of the noise with the driving signal COM and the discharge control signal Sp which are transferred by the wiring substrates 311, 312, 313, 314, and 315 is reduced.

Above, the first and second embodiments have been described above, but the invention is not limited to the embodiments, and can be implemented in various aspects without departing from the gist thereof. For example, the above-described embodiments can also be appropriately combined with each other.

The invention includes substantially the same configuration as the configuration described in the embodiment (for example, a configuration having the same function, method, and result, or a configuration having the same object and effect). Further, the invention includes a configuration in which non-essential parts of the configuration described in the embodiments are replaced. In addition, the invention includes a configuration that can achieve the same operation and effect as those of the configuration described in the embodiment, or a configuration that can achieve the same object. Further, the invention includes a configuration in which a known technology is added to the configuration described in the embodiment.

What is claimed is:

1. A head unit comprising:
a first substrate provided with a first terminal and a second terminal;
a second substrate provided with a third terminal;
a first flexible wiring substrate that connects the first terminal and the third terminal to each other;
a first driving module that includes a plurality of first piezoelectric elements, a plurality of first cavities which are associated with the plurality of first piezoelectric elements and of which an internal volume changes due to displacement of the associated first piezoelectric elements, and a plurality of first nozzles which are associated with the plurality of first cavities, which discharge a liquid corresponding to the change in the internal volume of the associated first cavities, and of which the provided number is 600 or more with a density of 300 or more per one inch, and is electrically connected to the second substrate;
a third substrate provided with a fourth terminal;
a second flexible wiring substrate that connects the second terminal and the fourth terminal to each other;
a second driving module that includes a plurality of second piezoelectric elements, a plurality of second cavities which are associated with the plurality of second piezoelectric elements and of which an internal volume changes due to displacement of the associated second piezoelectric elements, and a plurality of second nozzles which are associated with the plurality of second cavities, which discharge a liquid corresponding to the change in the internal volume of the associated second cavities, and of which the provided number is 600 or more with a density of 300 or more per one inch, and is electrically connected to the third substrate; and
a liquid flow passage which is positioned between the second substrate and the third substrate, and supplies a liquid to the first driving module and the second driving module,
wherein the first substrate is positioned on the second substrate side in a direction intersecting with a direction in which a liquid is discharged from the first nozzle or the second nozzle.

2. The head unit according to claim 1,
wherein at least one side of the first substrate is positioned so as to overlap at least one side of the second substrate in the direction in which the liquid is discharged from the first nozzle or the second nozzle.

3. The head unit according to claim 1,
wherein the liquid flow passage is positioned further on the third substrate side than the first substrate in the direction intersecting with the direction in which the liquid is discharged from the first nozzle or the second nozzle.

4. The head unit according to claim 1,
wherein a part of the first flexible wiring substrate is positioned between the second substrate and the liquid flow passage.

5. The head unit according to claim 1,
wherein a part of the second flexible wiring substrate is positioned between the third substrate and the liquid flow passage.

6. The head unit according to claim 1, further comprising:
a fifth terminal provided in the second substrate;
a fourth substrate provided with a sixth terminal; and
a third flexible wiring substrate that connects the fifth terminal and the sixth terminal to each other.

7. The head unit according to claim 6,
wherein a part of the third flexible wiring substrate is positioned between the fourth substrate and the liquid flow passage.

8. The head unit according to claim 6,
wherein, in the direction in which the liquid is discharged from the first nozzle or the second nozzle, a distance between the first substrate and the second substrate is greater than a distance between the second substrate and the fourth substrate, and the distance between the second substrate and the fourth substrate is greater than a distance between the first driving module and the fourth substrate.

9. The head unit according to claim 6, further comprising:
a seventh terminal provided in the third substrate;
a fifth substrate provided with an eighth terminal; and
a fourth flexible wiring substrate that connects the seventh terminal and the eighth terminal to each other.

10. The head unit according to claim 9,
wherein a part of the fourth flexible wiring substrate is positioned between the fifth substrate and the liquid flow passage.

11. The head unit according to claim 9,
wherein a difference between a distance between the second substrate and the fourth substrate and a distance between the third substrate and the fifth substrate is greater than a difference between a distance between the fourth substrate and the first driving module and a distance between the fifth substrate and the second driving module, and
wherein a difference between a distance between the first substrate and the second substrate and a distance between the first substrate and the third substrate is greater than a difference between the distance between the second substrate and the fourth substrate and the distance between the third substrate and the fifth substrate.

12. The head unit according to claim 9,
wherein the first substrate has a ninth terminal and transfers a driving signal for displacing at least one of the first piezoelectric element and the second piezoelectric element and a control signal for controlling the driving signal, from the ninth terminal to the first terminal and the second terminal.

13. The head unit according to claim 12,
wherein the driving signal and the control signal are transferred to the second substrate and the third substrate.

14. The head unit according to claim 12,
wherein the driving signal and the control signal are transferred to the fourth substrate and the fifth substrate.

15. The head unit according to claim 9,
wherein one or a plurality of each of the second substrate, the third substrate, the fourth substrate, and the fifth substrate are provided,
wherein the total number of the second substrates and the third substrates is greater than the number of the first substrates, and
wherein the total number of the fourth substrates and the fifth substrates is greater than the total number of the second substrates and the third substrates.

16. The head unit according to according to claim 9, further comprising:
an outer wall portion that surrounds the second substrate and the first flexible wiring substrate,
wherein a distance between the second substrate and the outer wall portion is smaller than a distance between the first flexible wiring substrate and the outer wall portion.

17. The head unit according to claim 16,
wherein the outer wall portion surrounds the third substrate and the second flexible wiring substrate, and
wherein a distance between the third substrate and the outer wall portion is smaller than a distance between the second flexible wiring substrate and the outer wall portion.

18. The head unit according to claim 16,
wherein the outer wall portion surrounds the fourth substrate and the third flexible wiring substrate, and
wherein a distance between the fourth substrate and the outer wall portion is smaller than a distance between the third flexible wiring substrate and the outer wall portion.

19. The head unit according to claim 16,
wherein the outer wall portion surrounds the fifth substrate and the fourth flexible wiring substrate, and
wherein a distance between the fifth substrate and the outer wall portion is smaller than a distance between the fourth flexible wiring substrate and the outer wall portion.

* * * * *